(12) United States Patent
Bonora et al.

(10) Patent No.: US 6,612,797 B1
(45) Date of Patent: Sep. 2, 2003

(54) CASSETTE BUFFERING WITHIN A MINIENVIRONMENT

(75) Inventors: Anthony C. Bonora, Menlo Park, CA (US); William J. Fosnight, Austin, TX (US); Joshua W. Shenk, Austin, TX (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/313,945

(22) Filed: May 18, 1999

(51) Int. Cl.$^7$ .............................................. B65G 49/07
(52) U.S. Cl. .................... 414/217; 414/217.1; 414/411; 414/940
(58) Field of Search .............................. 414/217, 217.1, 414/411, 416.01, 461.03, 416.08, 940

(56) References Cited

U.S. PATENT DOCUMENTS

| | | | |
|---|---|---|---|
| 5,110,248 A | * 5/1992 | Asano et al. ................ 414/217 |
| 5,431,600 A | 7/1995 | Murata et al. | |
| 5,562,383 A | 10/1996 | Iwai et al. | |
| 5,628,604 A | 5/1997 | Murata et al. | |
| 5,674,039 A | 10/1997 | Walker et al. | |
| 5,752,796 A | 5/1998 | Muka | |
| 5,788,458 A | 8/1998 | Bonora et al. | |
| 6,053,980 A | * 4/2000 | Suda et al. ................ 414/217 |
| 6,074,154 A | 6/2000 | Ueda et al. | |
| 6,079,927 A | 6/2000 | Muka | |
| 6,102,647 A | * 8/2000 | Yap ............................ 414/539 |
| 6,183,186 B1 | * 2/2001 | Howells et al. ......... 414/416.01 |
| 6,186,723 B1 | * 2/2001 | Murata et al. .............. 414/940 |
| 2001/0014267 A1 | * 8/2001 | Yamaga et al. ............. 414/217 |

* cited by examiner

Primary Examiner—James W. Keenan
(74) Attorney, Agent, or Firm—O'Melveny & Myers LLP

(57) ABSTRACT

A SMIF interface is disclosed for buffering one or more cassettes within a minienvironment affixed to a process tool. The interface includes a load port formed of a port door and a port plate circumjacent thereabout, and a minienvironment mounted to port plate. The SMIF interface and/or process tool includes at least one shelf for storing a cassette after the load port separates the cassette from its transport pod. In operation, while a first cassette is located within the process tool, a second pod is seated on the load port, the cassette is separated from the pod and the cassette is stored on a storage shelf. When processing on the first cassette is completed, the second cassette is loaded into the processing tool. The first cassette is returned to the pod and removed from the load port. A cassette from a new pod is then seated on the load port, separated from its pod and stored on the storage shelf. This process continues until processing on each scheduled wafer lot is completed. By providing a buffer of cassettes within the minienvironment of the SMIF interface, the processing tool is no longer dependent on timely delivery of pods to the interface to ensure that the process tool does not sit idle.

9 Claims, 19 Drawing Sheets

CASSETTE BUFFERING WITHIN A MINIENVIRONMENT

BACKGROUND OF THE INVENTION

1. Field of the Invention

The present invention relates to the transfer of workpieces such as semiconductor wafers from a storage and transport pod to a process tool, and in particular to a system for allowing pods to be buffered within a minienvironment adjacent a process tool.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 0.5 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is located in a vertical plane, and the wafers are supported either in a cassette mounted within the pod shell, or to shelves mounted in the pod shell. For both front opening and bottom opening pods, a pod door includes an interior surface which is included as part of the sealed pod environment, and an exterior surface which is exposed to the environment of the wafer fab.

In conventional SMIF systems, in order to transfer workpieces such as semiconductor wafers between a SMIF pod and a process tool within a wafer fab, a pod is typically loaded either manually or automatedly onto a load port of a minienvironment on the front of the tool. Thereafter, mechanisms within the load port decouple the pod shell from the pod door, and then mechanisms within the SMIF interface separate the shell from the door to allow transfer of the cassette and/or wafers. A workpiece handling robot thereafter transfers the workpiece(s) to and from the process tool for processing. After processing of the workpiece(s) at the tool is finished, and the workpiece(s) have been returned to the pod, the SMIF interface thereafter couples the shell and door together, and the pod is transferred from the load port so that the next pod may be brought to the tool and the process repeated.

Presently, a semiconductor wafer fab may cost in excess of $1 billion to outfit, and approximately 80% of that cost is the cost of process tools. It is therefore desirable to maximize the utilization of these tools, and substantial efforts are devoted to minimizing the time that the tools sit idle. In order to prevent significant idle time, it is known to include a local tool buffer adjacent the tool load ports at one or more of the process tools. A local tool buffer allows pods to be stored locally adjacent the tools and quickly transferred to the tool load port without having to constantly retrieve a pod from a remotely located stocker, or depend on timely delivery therefrom. A conventional local tool buffer is shown generally at 10 adjacent a process tool 12 in FIG. 1. As shown therein, a pod handling robot 14 is capable of transferring pods 16 between a plurality of local shelves 18 and the tool load ports 20 on the process tool 12.

Conventional local buffers, such as that shown in FIG. 1, have several shortcomings. First, they take up a significant amount of space within a wafer fab, which space is at a premium. Second, even though local tool buffers are able to supply pods to a load port in a timely manner, valuable time is still spent separating the cassette from within the pod upon initial loading of the pod on the load port, as well as when returning the cassette to the pod after processing of the workpieces in that cassette has been completed. The processing tool may be sitting idle during this time. It is known to provide two load ports on a process tool, so that a cassette may be separated from or returned to a pod on the first port while processing on workpieces from a pod on the second port is taking place. However, it is not feasible to provide a second load port on certain process tool configurations. Additionally, processing tools which are able to support two load ports require duplicate componentry for each load port, thus raising the cost and complexity of operation. Further still, two load ports take up additional space on the front end of the process tool, which space is at a premium.

SUMMARY OF THE INVENTION

It is therefore an advantage of the present invention to provide a cassette buffer for storing two or more cassettes within a minienvironment of the SMIF interface affixed to the process tool.

It is a further advantage of the present invention to allow loading of a new workpiece cassette into a process tool as soon as processing on the previous workpiece cassette has been completed.

It is a still further advantage of the present invention to decouple the process of cassette loading into the process tool from the delivery sequence of pods to the process tool.

It is another advantage of the present invention to utilize mechanisms that are presently in use for cassette loading in performing the additional function of improving tool throughput.

It is a further advantage of the present invention to operate with so-called "SMART tag" technology so that workpiece lots may be brought to a load port in one pod and transferred away in a second pod, without losing any identification information relating to that particular workpiece lot.

These and other advantages are provided by the present invention which in preferred embodiments relates to a system for buffering two or more cassettes within a minienvironment affixed to a process tool. The present invention is provided as part of a SMIF interface mounted on a frame affixed to the front end of a process tool. The interface includes a load port formed of a port door and a port plate circumjacent thereabout, and a minienvironment mounted to the port plate. The load port is provided for receiving a cassette-carrying pod and decoupling the pod shell from the pod door. Thereafter, translation mechanisms within the interface raise the port plate, the pod shell which is supported on the port plate, and the minienvironment. The port door with the workpiece cassette supported thereon remains stationary as the port plate moves upward.

According to the present invention, as processing occurs on wafers of a first cassette, at least a second cassette may be separated from its pod and stored either in or adjacent the process tool. Thus, upon completion of processing on the wafers of the first cassette, the cassettes may be interchanged quickly to minimize the idle time of the tool. In a preferred embodiment, the shelf may be mounted within the SMIF interface frame, at a height that allows a cassette to be transferred between the load port and the process tool below the shelf. In alternative embodiments, the shelf may be mounted in the process tool so that a cassette stored on the shelf may be quickly transferred into a processing position within the process tool upon completion of processing on a prior wafer lot. In another alternative embodiment, the storage shelf may be located within load port minienvironment, directly behind the port door, on a side of the port door opposite the access port to the process tool. It is understood that the minienvironment may include shelves in other locations, as well as more than one storage shelf. In a still further alternative embodiment, grippers may be provided on a lower surface of the port plate for gripping and storing a cassette as processing on the first cassette takes place.

In operation, while a first cassette is located within the process tool, a second pod is seated on the load port, the cassette is separated from the pod and the cassette is stored on the storage shelf. When processing on the first cassette is completed, the second cassette is loaded into the processing tool. The first cassette is returned to the pod of the second cassette and removed from the load port. A cassette from a new pod is then seated on the load port, separated from its pod and stored on the storage shelf. This process continues until processing on each scheduled cassette is completed. By providing a buffer of cassettes within the SMIF interface and/or process tool, the processing tool is no longer dependent on timely delivery of pods to the interface to ensure that it does not sit idle.

It is known to be able to track a particular workpiece lot through a fab via SMART tag or similar technologies, in which information relating to a particular workpiece lot is transmitted to and stored in a tag affixed to the pod in which that lot is carried. According to the present invention, a workpiece lot is brought to a load port in a first pod and transported away in a second pod. In embodiments of the invention utilizing SMART tag or similar technologies, the information stored in the tag on the second pod may be rewritten before the second pod with the new workpiece lot leaves a load port so that the second pod accurately identifies the new workpiece lot stored therein.

DESCRIPTION OF PREFERRED EMBODIMENTS

The present invention will now be described with reference to FIGS. 2 through 13B which in general relate to a system for buffering cassettes within a SMIF minienvironment affixed to a processing tool. While the present invention is described with respect to buffering semiconductor wafer cassettes, it is understood that cassettes including other workpieces, such as flat panel displays and reticles, may also be used with the present invention.

Figure 1:
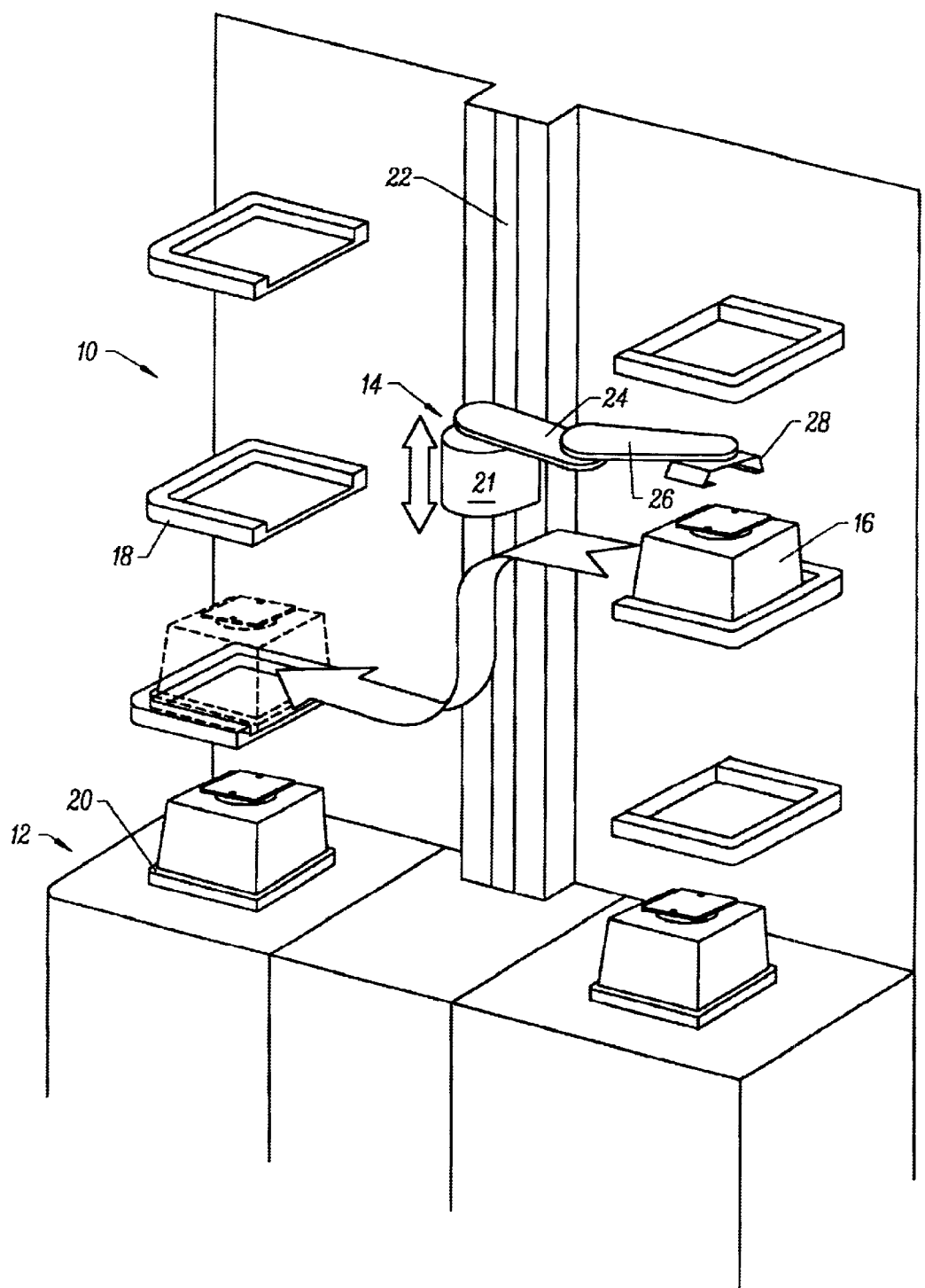
FIG. 1 is a perspective view of a conventional local tool buffer.
Figure 2:
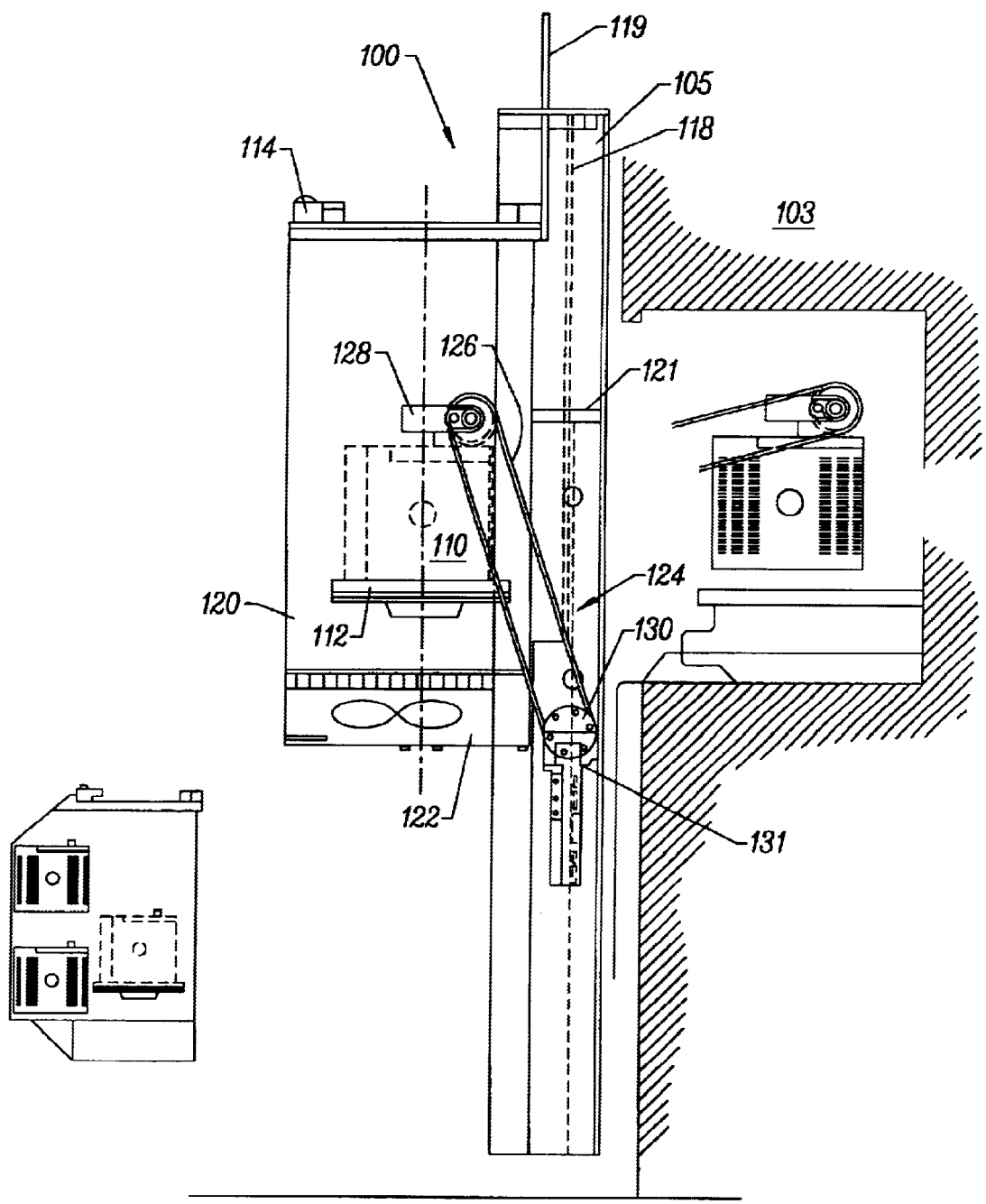
FIG. 2 is a side view of a system according to the present invention including a shelf mounted to the SMIF interface frame for storing a cassette.
Figure 3:
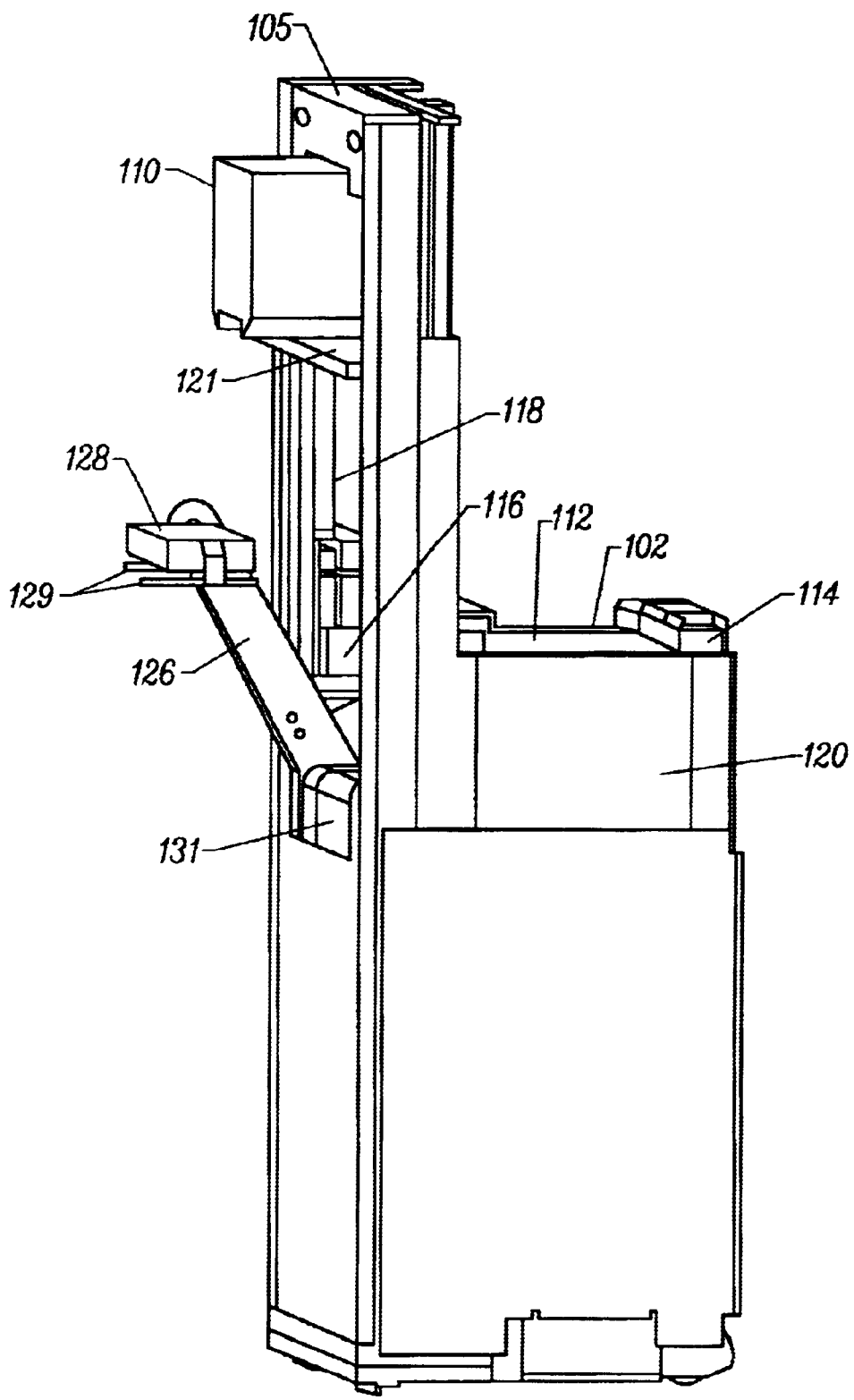
FIG. 3 is a perspective view of of a system according to the present invention including a shelf mounted to the SMIF interface frame for storing a cassette.

Referring now to FIGS. 2 and 3, there is shown a SMIF interface 100 mounted to a frame 105 on the front end of a process tool 103 for processing semiconductor wafers. The present invention may be adapted to operate with process tools which include their own minienvironment for housing wafers before and/or after processing, or with process tools which do not have their own minienvironment. The SMIF interface 100 includes a horizontally oriented load port 102 on which a SMIF pod 104 may be manually or automatedly loaded. As shown for example in FIG. 5A, pod 104 includes a shell 106 and a door 108 (the pod door and shell have been omitted from FIGS. 2 and 3 for clarity). The door 108 mates with the shell 106 to define a sealed environment in which a semiconductor wafer cassette 110 may be stored and transported.

Load port 102 includes a port door 112, and a port plate 114 surrounding the port door 112. When properly located on top of the load port 102, the pod door 108 lies in contact with the port door 112 and the outer rim of the shell 106 lies in contact with the port plate 114. The port door 112 preferably includes registration features on its surface for supporting a cassette 110 in a fixed and repeatable position. Load port 102 further includes latches (not shown) on the port plate that rotate into engagement with the shell 106 to secure the shell to the port plate. The movement of the latches into and out of engagement with the shell 106 may be accomplished by a conventional solenoid or motor, the operation of which is controlled by a central processing unit ("CPU") (not shown) for the system.

The interior of port door 112 includes a conventional decoupling mechanism for decoupling the pod door from the pod shell once the pod is loaded onto the load port. Details relating to such a decoupling mechanism are shown for example in U.S. Pat. No. 4,995,430, entitled "Sealable Transportable Pod Having Improved Latch Mechanism", to Bonora et al., which patent is assigned to the owner of the present application and which patent is incorporated by reference in its entirety herein.

The present invention further includes a minienvironment 120 affixed to the port plate 114. Minienvironment 120 is provided to isolate the wafer cassette 110 housed therein from the environment within the wafer fab. A fan and filter unit 122 may be provided for preventing particulates and/or contaminants from the environment within the wafer fab from entering into the minienvironment 120. The unit 122 may be provided in the base of the minienvironment 120 (as shown in FIG. 2) and/or may be provided at a top of frame 105 (as shown in FIGS. 5A–9J). The fan and filter unit preferably maintains the minienvironment 120 at a pressure higher than that of the surrounding environment to prevent the flow of air into the minienvironment. It is understood that the process tool preferably also includes a fan filter unit.

Port plate 114 and minienvironment 120 are affixed to a chassis 116. A drive nut (not shown) is rotationally mounted within the chassis 116 by, for example, tapered or roller bearings in a known manner, which drive nut is in turn threaded around a stationarily mounted lead screw 118 extending along one side of frame 105. A conventional drive motor, such as a stepper or brushless motor (not shown), is further mounted on the chassis 116, which motor rotates the drive nut in response to control signals from the CPU. Rotation of the drive nut in one direction will raise the port plate 114 and minienvironment 120, and rotation of the drive nut in the opposite direction will lower the port plate and minienvironment. The shell 106, supported on the port plate 114, moves upward and downward with the port plate. As the port plate 114 moves upward, the pod door 108 and wafer cassette 110 seated thereon, remain seated on the stationarily mounted port door 112 adjacent the access port to the process tool.

As would be appreciated by those of skill in the art, structures other than that disclosed above maybe used to raise and lower the port plate 114 in alternative embodiments. Additionally, alternative load port configurations are contemplated, such as an indexer-type load port where the port plate remains stationary and the port door, with the pod door and cassette supported thereon, lowers away from the port plate.

In a preferred embodiment, a shield 119 is fixedly attached to and extending up from the port plate 114. When the port plate 114 and minienvironment 120 are in their lowermost positions, the shield 119 covers an access port to the process tool to prevent entry of particulates into the process tool. The process tool may additionally be maintained at a pressure higher than that of the surrounding environment to prevent the flow of air into the process tool. As the port plate and minienvironment move upward, the shield 119 is also moved upward to uncover the access port and allow transfer of the wafer cassette 110 through the access port and into the process tool.

In a preferred embodiment, the shield 119 preferably comprises a pair of adjacent and parallel panels. When the port plate and minienvironment are in their uppermost positions, the panels overlap each other. As the port plate and minienvironment move downward, the two panels move down together. At some point during the downward movement, the upper edge of one of the panels will engage a top portion of frame 105, at which time that panel remains fixed. The second panel continues to move downward with the port plate and minienvironment until the port plate once again mates with the port door. The two panels of shield 119 thus prevent contaminants from entering the process tool 103 when the port plate and minienvironment are in a lowered position.

The SMIF interface 100 further includes a transfer assembly 124 capable of transferring wafer cassettes 110 between the port door 112, a storage shelf 121 (explained hereinafter) and the process tool 103. The transfer assembly 124 is reciprocatingly mounted in the frame 105, and includes a transfer arm 126 and a gripper mechanism 128. In its home position (not shown), the arm 126 and gripper mechanism 128 are preferably vertically oriented completely within the horizontal footprint of the frame 105 so as to take up a minimal amount of space. The arm 126 is rotatably mounted to a chassis 131 by a shaft 130. A drive nut (not shown) is rotationally mounted within the chassis 131 by, for example, tapered or roller bearings in a known manner, which drive nut is in turn threaded around the lead screw 118. Thus, both the port plate 114 and arm assembly 124 translate along lead screw 118. A conventional drive motor, such as a stepper or brushless motor (not shown) is further mounted on the chassis 131, which motor rotates the drive nut in response to control signals from the CPU.

Figure 4:
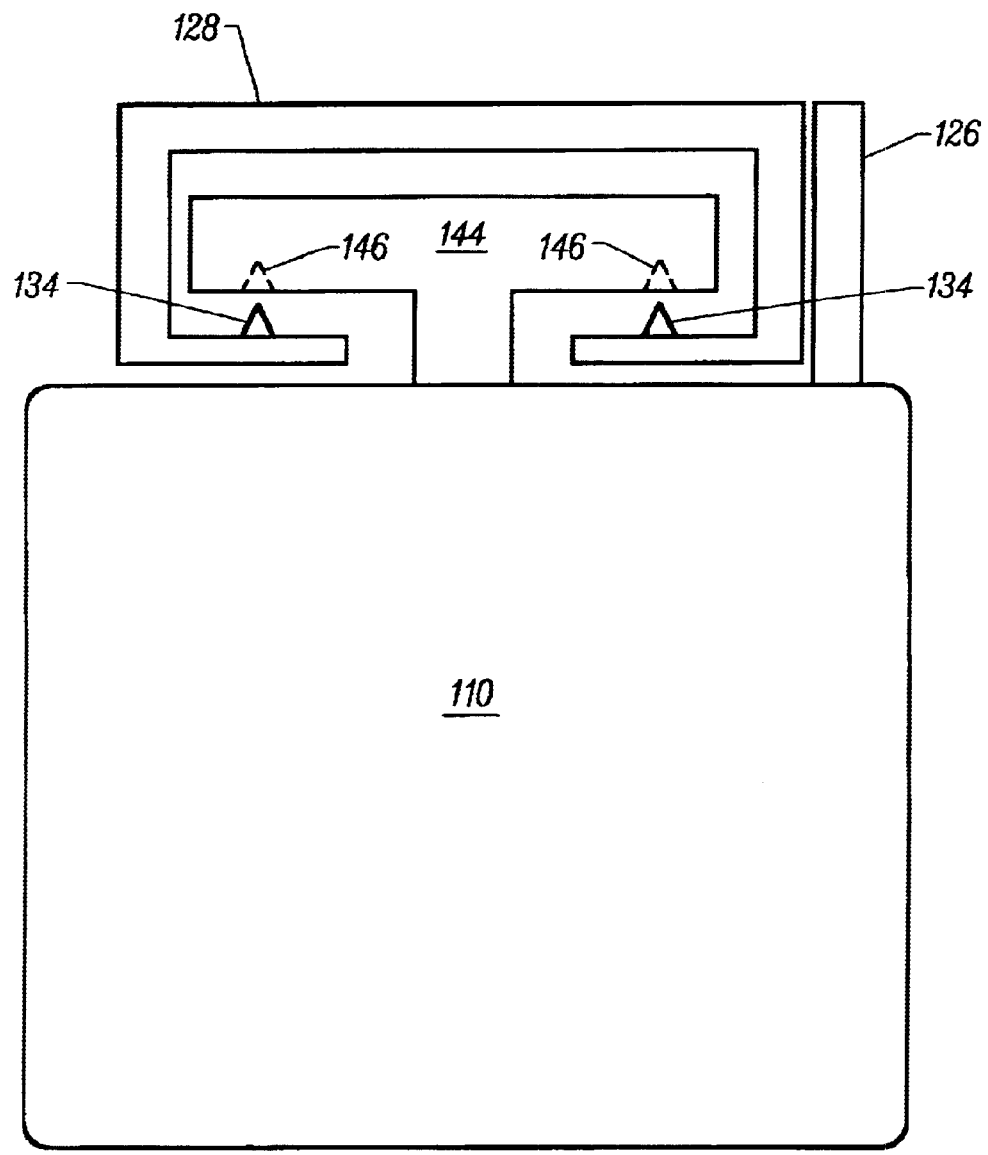
FIG. 4 is a side view of a gripper mechanism according to the present invention positioned over a cassette handle.

Separate and independent from the rotational mounting of a proximal end of the arm 126 to the shaft 130, the gripper mechanism 128 is rotationally mounted to a distal end of arm 126 so that the arm 126 and gripper mechanism 128 may rotate separately and simultaneously. In one embodiment of the gripper assembly, as shown in FIGS. 2 and 3, the gripper mechanism 128 may comprise an active gripper including moving jaws 129 that grasp and release the cassette. In alternative embodiments, as shown in FIG. 4, the gripper mechanism 128 may comprise a substantially "C"-shaped cross section. With such a shape, the gripper mechanism is capable of moving horizontally over and around a handle 144 conventionally provided on an upper surface of cassette 110. The handle may include detents 146 from mating with pins 134 formed in the gripper mechanism to prevent any relative movement between the cassette and the gripper mechanism during transport.

As is known in the art, the CPU controls the rotation and/or translation of the arm 126 and gripper mechanism 128 so that the gripper mechanism 128 may be properly positioned to grip and transfer the wafer cassettes 110 to and from the port door 112, the shelf 121 and the process tool 103. Additionally, as explained hereinafter, once a cassette is gripped by gripper mechanism 128, the gripper mechanism preferably rotates 90° so that the wafers are vertically oriented.

The present invention contemplates that one or more shelves 121 be located within the frame 105, the process tool 103, and/or minienvironment 120 of the load port. A preferred embodiment of the shelf 121 preferably includes slats or other openings to allow the flow of air therethrough so as not to prevent the air flow generated by the fan filter units in the minienvironment 120, frame 105 and/or process tool 103. The shelf 121 may additionally include registration features to ensure a fixed and repeatable position of a cassette seated thereon.

The operation of the cassette buffering system according to a preferred embodiment of the present invention will now be described with reference to FIGS. 5A–5J, which each show side views of load port 102 and minienvironment 120 affixed to the front of a process tool 103. According to this embodiment, the shelf is preferably mounted to the SMIF interface frame 105, at a height allowing the transfer assembly 124 to transfer a cassette from the port door into the process tool beneath the shelf 121 as explained hereinafter. The shelf 121 is preferably mounted to the sides of the frame 105 so that there is a clear space in front of and behind (i.e., to the left and right, respectively, in FIGS. 5A–5J) the shelf 121 for the cassette to be transported. The width of the shelf 121 preferably fits entirely within the frame 105, so as not to interfere with the translation of the shield or port plate, and so as not to increase the required horizontal footprint of the frame mounted to the process tool. Although one such shelf is shown, it is understood that more than one shelf may be provided above and below, or side to side, with respect to each other in frame 105.

Figure 5A:
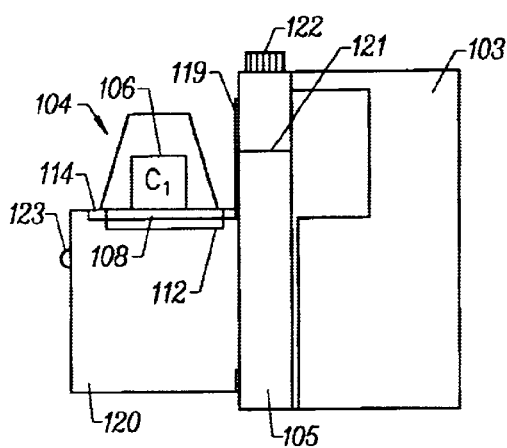
FIGS. 5A–5J are side views showing various positions of the cassette buffering system according to the present invention.
Figure 5B:
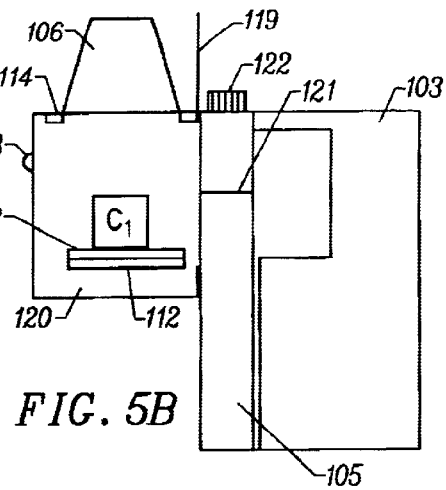

Upon start up of wafer processing, a pod 104 including a wafer cassette $C_1$ is loaded onto load port 102 at the load height. The load height is specified by the SEMI standards as 900 mm from the ground. Thereafter, as explained above and as shown in FIG. 5B, the port plate and minienvironment 120 move upward to separate the pod shell 106 from the pod door 108 so as to leave the cassette $C_1$ and the pod door seated on port door 112 within the minienvironment 120. Shield 119 is also shown in the figures. In FIG. 5A, it is shown covering an opening in frame 105. In FIG. 5B, it is raised with the port plate 114 and minienvironment 120 to opening in the frame for transfer of the cassette therethrough.

Figure 5C:
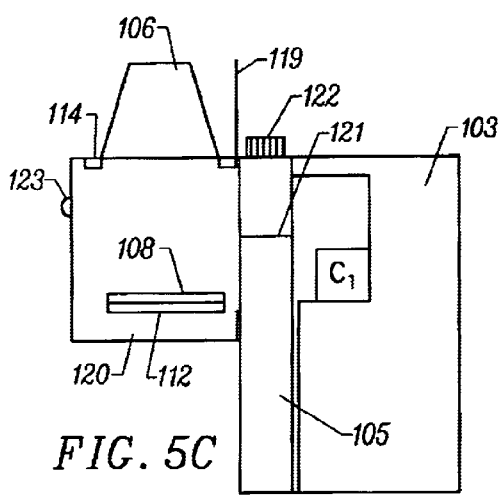
Figure 5D:
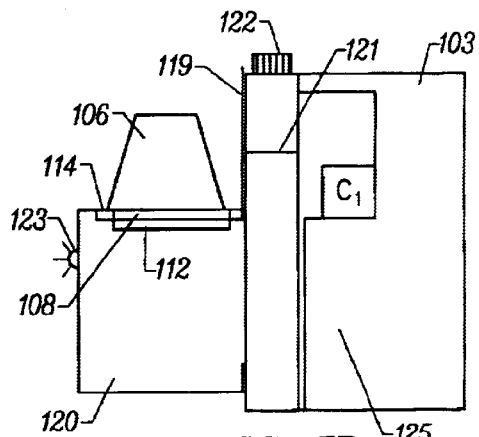
Figure 5E:
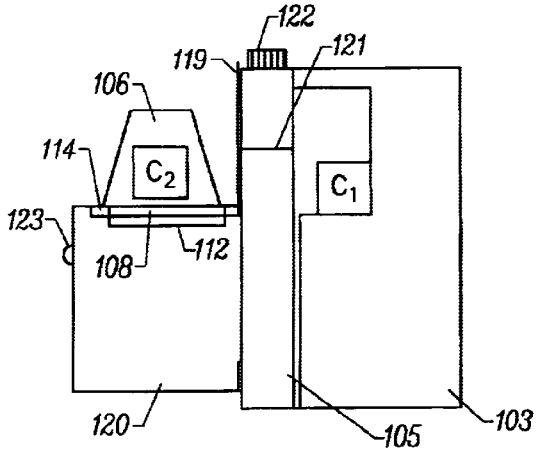

Once the shell 106 has been separated from the door 108, the transfer assembly 124 (not shown in FIGS. 5A–5J) transfers the cassette $C_1$ through frame 105 and into the process tool 103 as shown in FIG. 5C. Although not shown, once in the process tool, the wafers are transferred by a wafer handling robot between the cassette and an isolated processing chamber. As previously indicated, sufficient space is provided beneath shelf 121 so that the cassette may be transported into the process tool below the shelf 121. Alternatively, the transfer mechanism may transfer the cassette $C_1$ up and over shelf 121 and then into process tool 103. After the cassette is positioned in the process tool, the port plate 114 and minienvironment 120 are lowered to the load height to once again couple the pod shell 106 to the pod door 108. This state is shown in FIG. 5D.

The cassette buffering system according to the present invention further includes an audible and/or visible alert 123 of known construction. Once the cassette $C_1$ has been transferred into the process tool 103 and the pod 104 has been coupled together as shown in FIG. 5D, the alert 123 may omit an audible and/or visible signal indicating to an operator that the pod 104 is ready to be removed and replaced by a new pod. It is also contemplated that the alert 123 send a page to one or more operators indicating that the load port is ready to receive a new pod. Once the pod is removed and replaced by a new pod including for example a wafer cassette $C_2$ as shown for example in FIG. 5E, the CPU may turn off alert 123. It is understood that the alert 123 may be omitted in alternative embodiments, especially those including automated loading of the pod onto the load port.

Figure 5F:
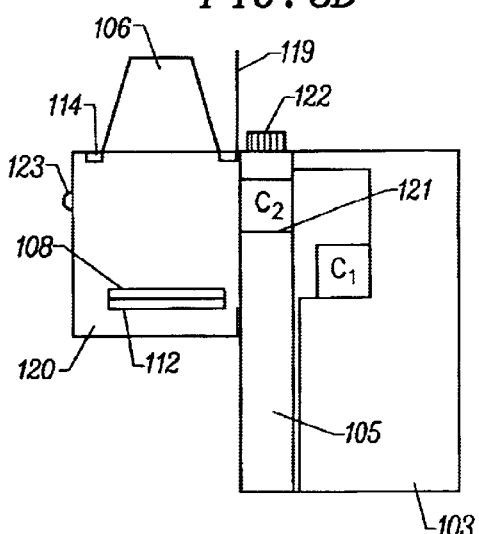

With the cassette $C_1$ positioned within the process tool 103, the pod shell 106 around cassette $C_2$ is separated from the pod door and the transfer assembly 124 transfers the cassette $C_2$ to the storage shelf 121 as shown in FIG. 5F. This occurs while processing is being carried out on wafers from cassette $C_1$.

As shown in FIG. 5F, the port plate has raised sufficiently high for the back end of the cassette $C_1$ to protrude slightly into the minienvironment 120, beneath the port plate. In an alternative embodiment shown in FIG. 5K, the cassette $C_1$ may instead protrude into a bezel, or space, 127 added onto the process tool. In this embodiment, it is contemplated that a cassette may be loaded by the transfer assembly into the process tool beneath the shelf 121, and then up onto shelf 121 from the process tool side. A consequence of this alternative embodiment is that the vertical stroke of the port plate may be decreased so that the port plate does not rise above shelf 121.

Figure 5G:
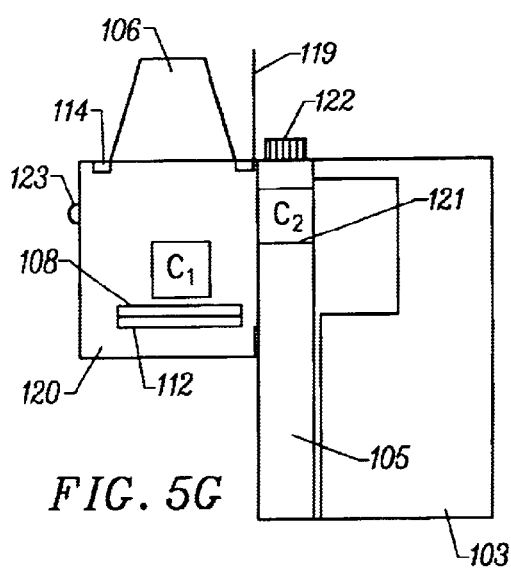
Figure 5H:
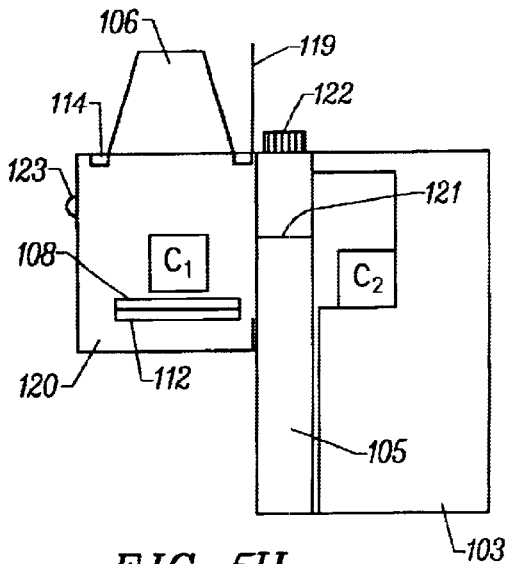
Figure 5I:
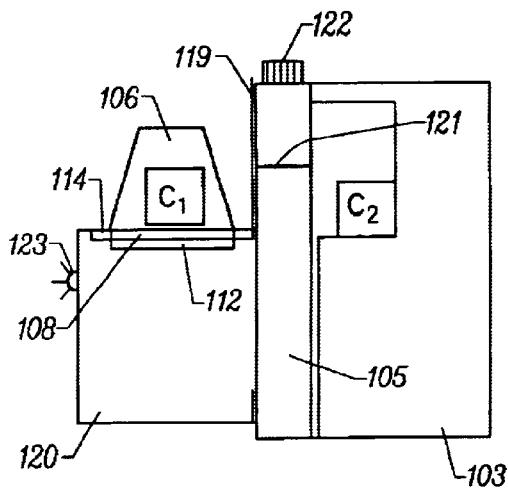
Figure 5J:
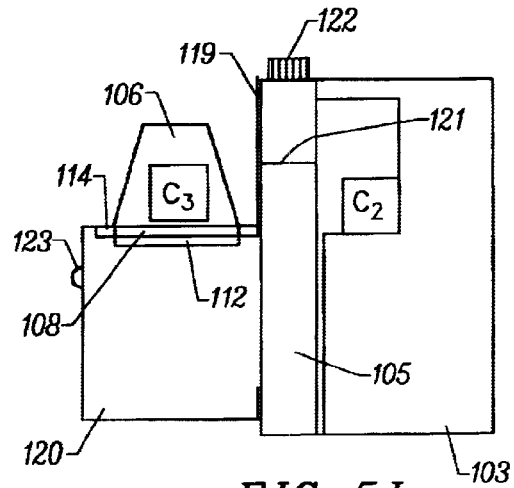
Figure 5K:
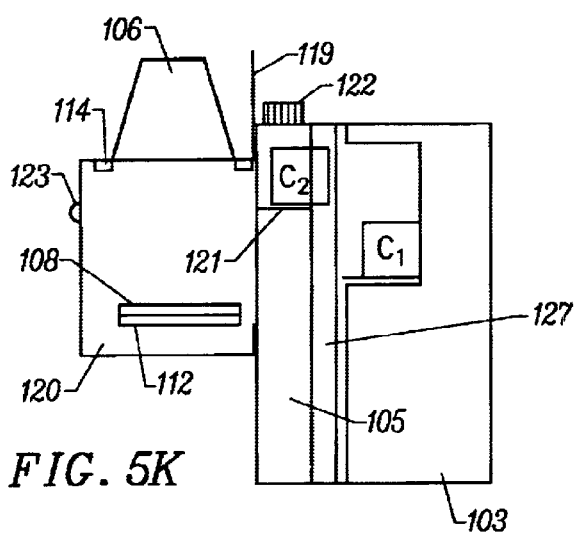
FIG. 5K is a side view of an alternative embodiment of the cassette buffering system according to the present invention.

With reference to the embodiments of either FIG. 5F or 5K, as indicated above, the gripper mechanism preferably rotates the cassette 90° as it moves the cassette to the shelf 121 so that the wafers are vertical and the open end of the cassette is facing upwards. Cassettes typically include structure at a back portion that allow the cassettes to sit stabilized in this position. The vertical position of the wafers allow air flow through the cassette while seated on the shelf 121 by the fan filter unit 122 in the minienvironment 120 and/or frame 105. It is understood that in an alternative embodiment, the cassette may not be rotated when it is transferred to the shelf 121 so that the wafers are horizontally oriented.

After processing on the cassette $C_1$ is complete, cassette $C_1$ is moved by the transfer assembly 124 from the process tool 103 back to the pod door which remains seated on the port door 112 as shown in FIG. 5G. Thereafter, the transfer mechanism 124 moves to the cassette $C_2$ to transfer the cassette $C_2$ from shelf 121 into the process tool 103 at which time processing of the wafers within the cassette $C_2$ may be carried out.

As processing of the wafers from cassette $C_2$ occurs, the port plate 114 and minienvironment 120 are lowered to the load height to again couple the pod door 108 to pod shell 106 to provide a sealed environment around wafer cassette $C_1$ as shown in FIG. 5I, at which time the pod including cassette $C_1$ is ready for transport away from the load port 102. The alert 123 sends off an audible and/or visible signal as described above again indicating that the pod on the load port 102 is ready from transport away from the system, and that a new pod, including for example a cassette $C_3$, is ready for placement on load port 102 as shown in FIG. 5J. The positions of system shown in FIGS. 5I and 5J are identical to the positions shown in FIGS. 5D and 5E. The system will continue to cycle through the positions shown in FIGS. 5D–5I until processing of the desired number of wafer lots is complete. After the last cassette has been loaded into process tool 103, an empty pod 104 is loaded on a load port 102. The shell 106 and door 108 of this empty pod are separated, and when processing on the final cassette is completed, this cassette is loaded into the empty pod as described above so that it may be carried away from load port 102.

Figure 6A:
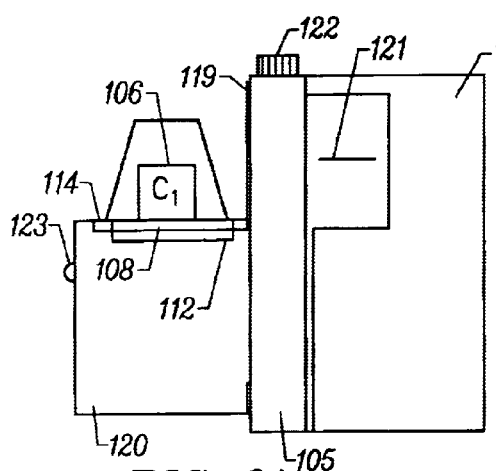
FIGS. 6A–6J are side views showing various positions of the cassette buffering system according to alternative embodiments of the present invention.
Figure 6B:
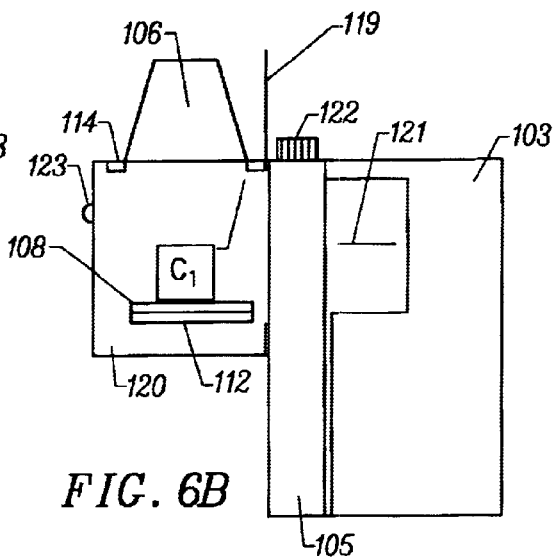
Figure 6C:
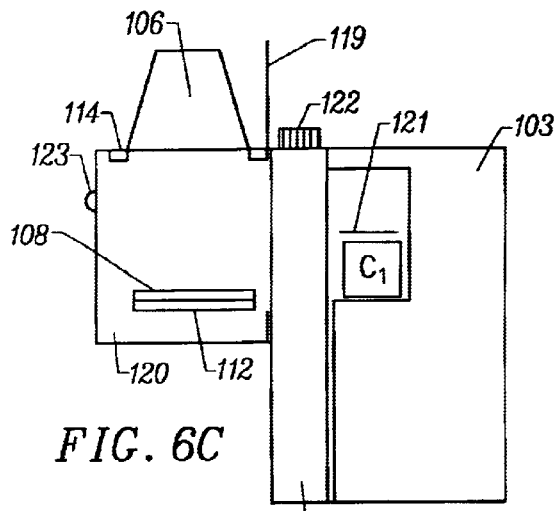
Figure 6D:
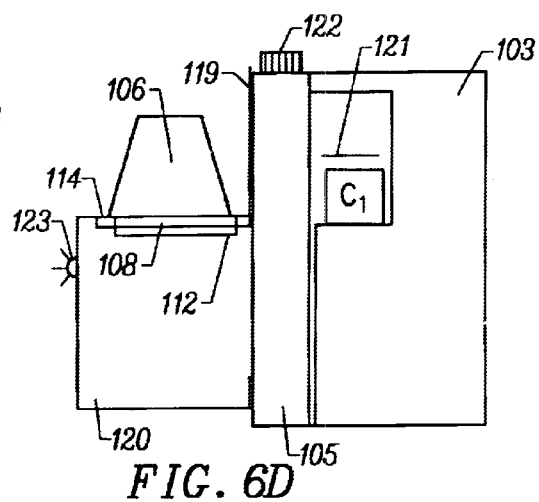
Figure 6E:
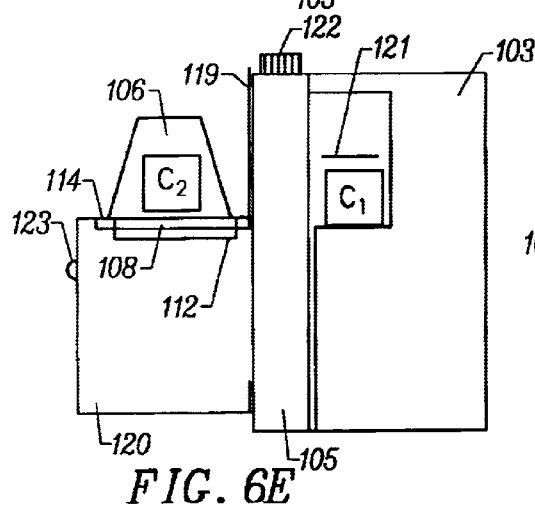
Figure 6F:
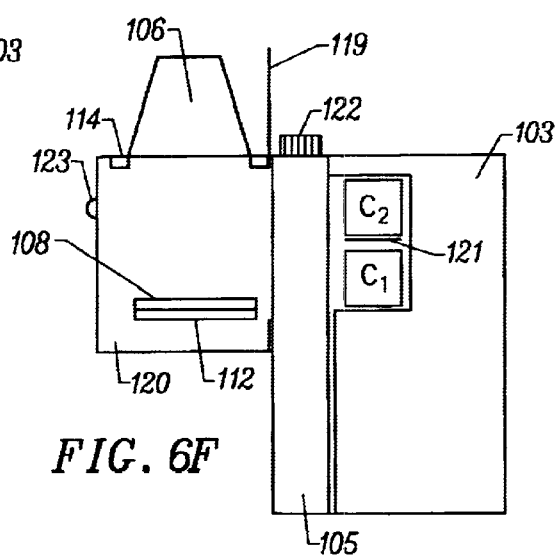
Figure 6G:
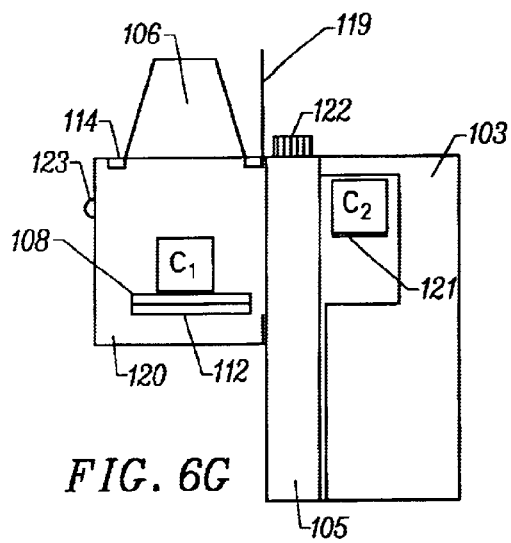
Figure 6H:
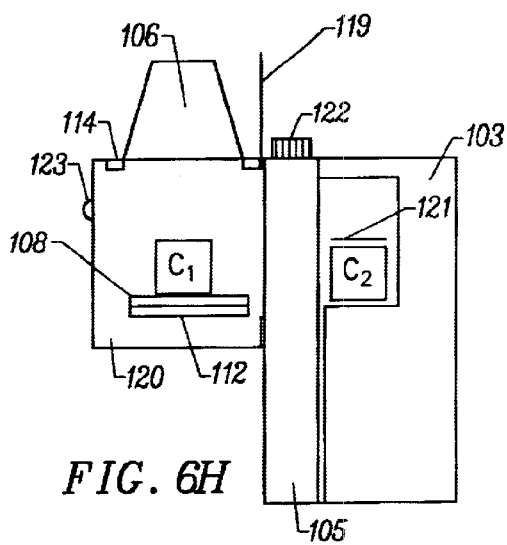
Figure 6I:
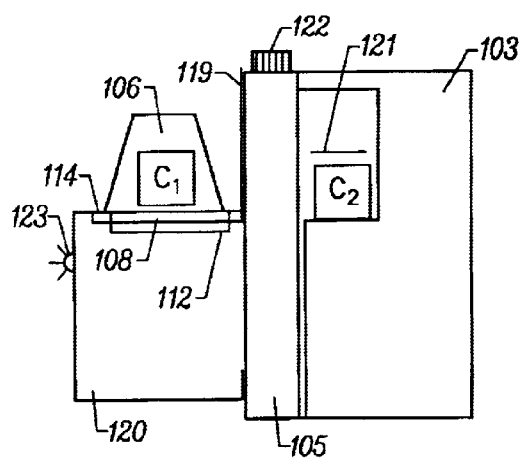
Figure 6J:
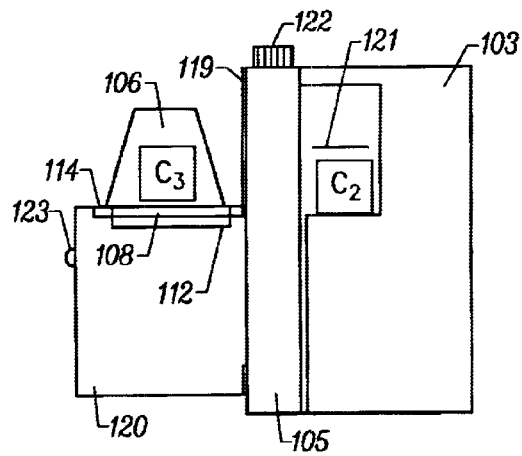

An alternative embodiment of the present invention is shown in FIGS. 6A–6J. The structure and operation of this alternative embodiment is similar to that shown in FIGS. 5A–5J, with the exception that the shelf 121 is instead mounted directly within process tool 103. A first cassette $C_1$ is loaded into the process tool 103 as described above, and, during processing of the wafers from cassette $C_1$ in the isolated processing chamber, a second cassette is loaded as described above onto the shelf 121. These steps are shown in FIGS. 6A–6F. Once processing of the wafers from cassette $C_1$ is completed, the transport assembly 124 transfers the cassette $C_1$ from the process tool 103 onto pod door 108 as shown in FIG. 6G. Thereafter, transport assembly 124 transfers the cassette $C_2$ from shelf 121 into a processing position within process tool 103 as shown in FIG. 6H. During processing of the wafers from cassette $C_2$, port plate 114 and minienvironment 120 are lowered to couple the pod 104 together and the alert 123 sends a signal indicating the cassette $C_1$ is ready for transport away from load port 102 as shown in FIG. 6I. A new pod including for example a cassette $C_3$ is then located on the load port as shown in FIG. 6J, and the process then repeats.

A further alternative embodiment of the present invention is shown in FIGS. 7A–7L. In this embodiment, a single shelf 121 is affixed to an interior wall of the minienvironment 120, so as to translate up and down with the minienvironment 120 and port plate 114. The shelf 121 is mounted in such a way that the shelf may pass through the horizontal plane including the stationary port door 112 as it translates vertically without contact or interference between the shelf 121 and port door 112. In this embodiment, the size of the minienvironment 120 through a horizontal cross section may be increased relative to embodiments described above to accommodate both the shelf 121 and the port door 112. In a preferred embodiment, the shelf may be located directly behind the port door 112, i.e., on a side of the port door opposite the access port to the process tool 103. The shelf 121 preferably includes registration features on its surface for supporting a cassette in a fixed and repeatable position, as well as openings to allow the flow of air therethrough as described above.

Figure 7:
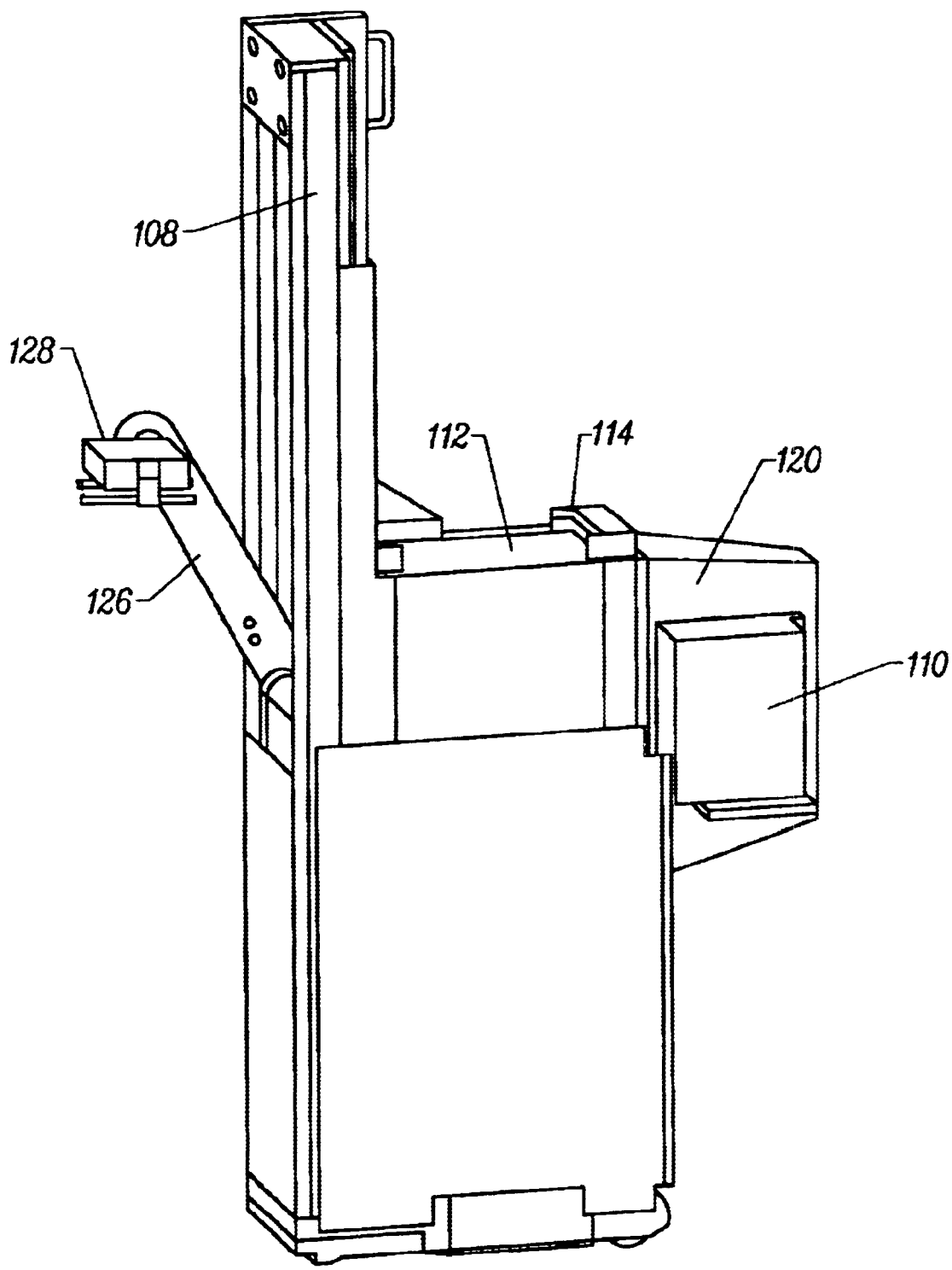
FIG. 7 is a perspective view of the cassette buffering system according to a further alternative embodiment of the present invention.
Figure 7A:
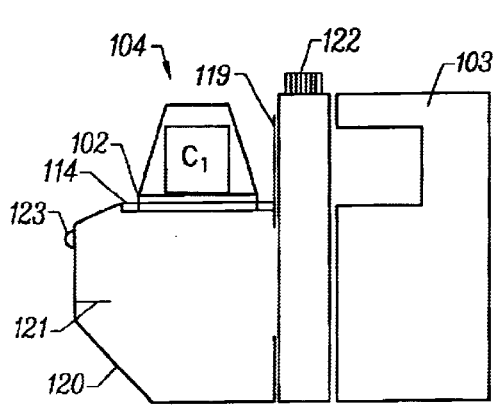
FIGS. 7A–7L are side views showing various positions of the cassette buffering system according to the alternative embodiment of FIG. 7.
Figure 7B:
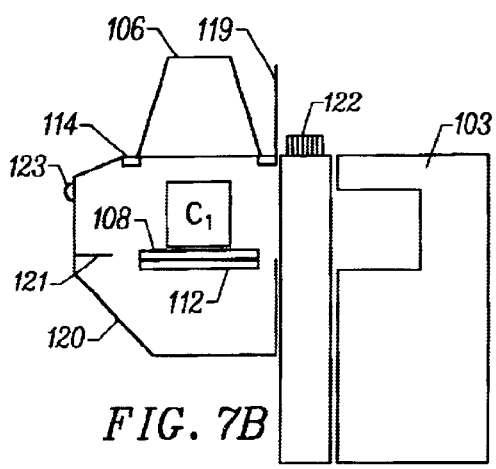

FIG. 7 is a perspective view of a load port 102 and minienvironment 120 affixed to the front of a process tool 103. FIGS. 7A–7L each show side views of the various positions of the system of FIG. 7 for buffering one or more cassettes in the minienvironment 120. Upon start up of wafer processing, a pod 104 including a wafer cassette $C_1$ is loaded onto load port 102 at the load height. Thereafter, as explained above and as shown in FIG. 7B, the port plate and minienvironment 120 move upward to separate a pod shell 106 from the pod door so as to leave the cassette $C_1$ and pod door 108 seated on port door 112 within minienvironment 120. Shield 119 is also shown in the figures. In FIG. 7A it is shown covering the opening in the frame 105, and in FIG. 7B, it is raised with the port plate 114 and minienvironment 120 to expose the opening in the frame 105 and the interior of process tool 103.

Figure 7C:
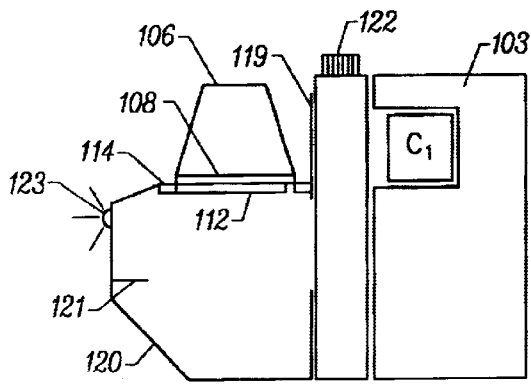
Figure 7D:
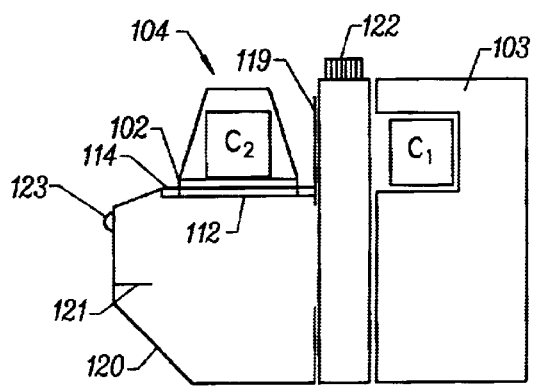
Figure 7E:
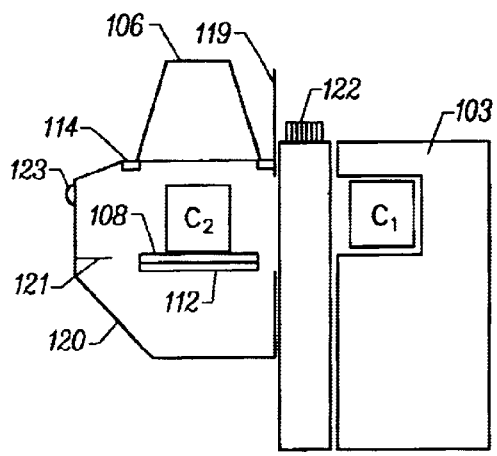
Figure 7F:
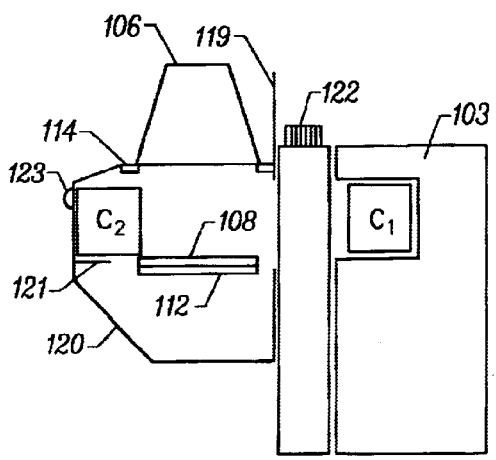

Once the shell 106 has been separated from door 108, the transfer assembly 124 (not shown in FIGS. 7A–7L) transfers the cassette $C_1$ into the process tool 103. Thereafter, the port plate and minienvironment 120 are lowered to the load height to once again couple the pod shell 106 to the pod door 108. This state is shown in FIG. 7C. Once the cassette $C_1$ has been transferred into process tool 103 and the pod 104 has been coupled together as shown in FIG. 7C, the alert 123 may emit an audible and/or visible signal indicating to an operator that the pod 104 is ready to be removed and replaced by a new pod. Once the pod is removed and replaced by a new pod including for example a wafer cassette $C_2$ as shown in FIG. 7D, the CPU may turn alert 123 off. With the cassette $C_1$ positioned within the process tool 103, the pod shell 106 around cassette $C_2$ is separated from the pod door as shown in FIG. 7E, and the transfer assembly 124 transfers the cassette $C_2$ to a storage shelf 121 mounted within the minienvironment 120 as shown in FIG. 7F. This occurs while processing is occurring on the wafers within cassette $C_1$.

Figure 7G:
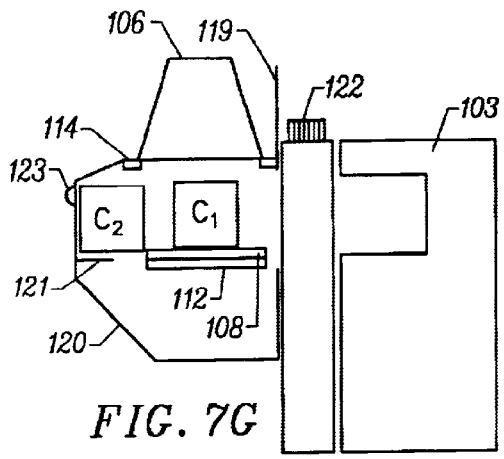
Figure 7H:
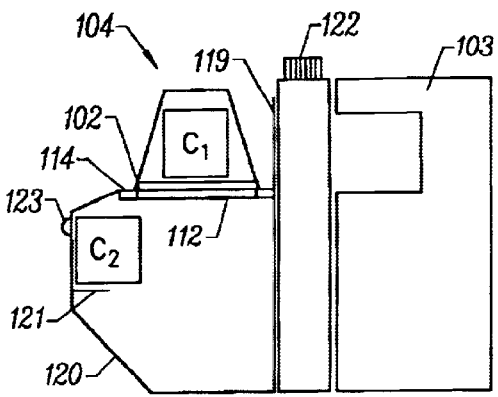

After processing on cassette $C_1$ is complete, cassette $C_1$ is moved by the transfer assembly 124 from the process tool 103 back to the pod door 108 which remains seated on port door 112 as shown in FIG. 7G. Thereafter, the port plate and minienvironment 120 are lowered to the load height to again couple pod door 108 to pod shell 106 to provide a sealed environment around wafer cassette $C_1$ as shown in FIG. 7H.

Figure 7I:
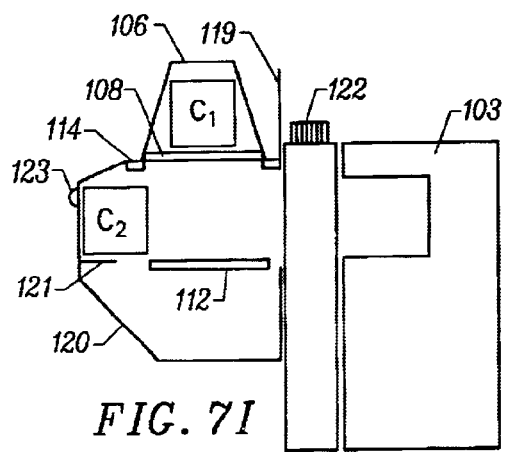
Figure 7J:
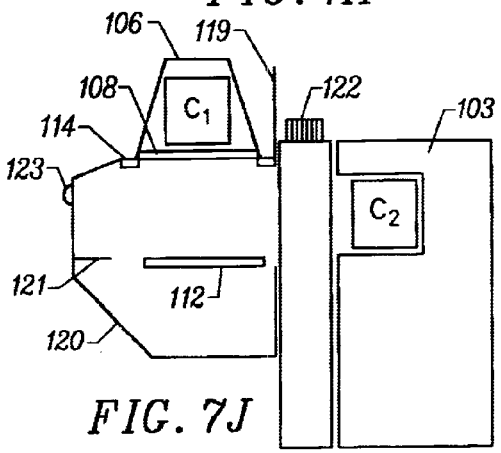

Once pod 104 around cassette $C_1$ has been sealed, load port 102 and minienvironment 120 once again move upward as shown in FIG. 7I to clear a path for the stored cassette $C_2$ to be transferred into the process tool 103 as shown in FIG. 7J by the transfer assembly 124. As shown in FIG. 7I, the pod door 108 remains coupled to the pod shell 106 so that the pod door 108 and cassette $C_1$ move upward with the port plate and pod shell.

Figure 8A:
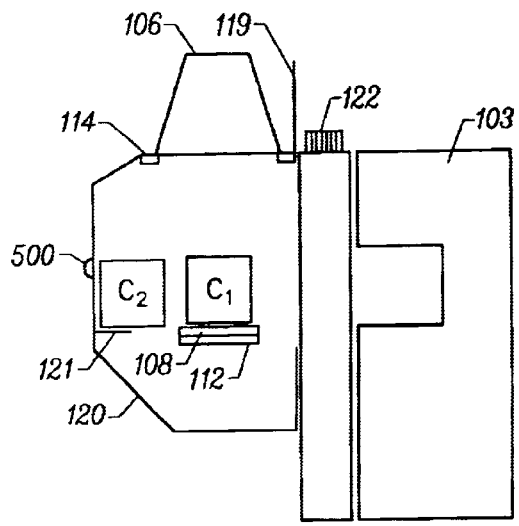
FIGS. 8A–8C are side views of a cassette buffering system operating according to another alternative embodiment of the present invention.
Figure 8B:
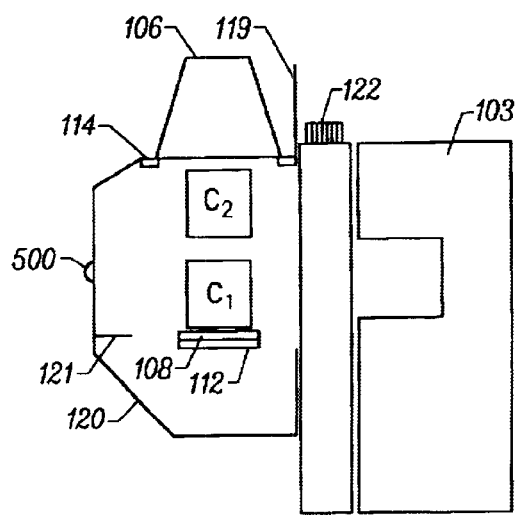
Figure 8C:
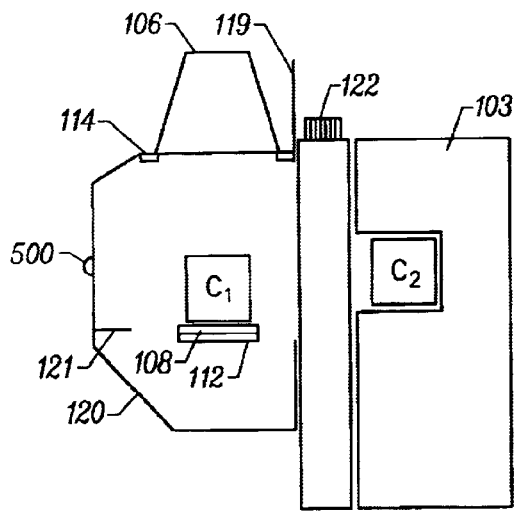

As described above with respect to FIGS. 7G through 7J, the cassette $C_1$ is raised within the pod to clear a path for cassette $C_2$ to be loaded into the process tool. Alternatively, as shown in FIGS. 8A through 8C, the cassette $C_2$ may be loaded into the process tool immediately after cassette $C_1$ has been removed from the process tool and is positioned on the port door 112. In particular, the transfer arm assembly 124 will transfer the cassette $C_2$ over the cassette $C_1$ on the port door 112, as shown in FIG. 8B, into the process tool 103, as shown in FIG. 8C. It is also contemplated that the port door be mounted for vertical translation (either on lead screw 118 or another linear drive assembly) so as to lower the cassette $C_1$ to allow transfer of the cassette $C_2$ into the process tool.

Figure 7K:
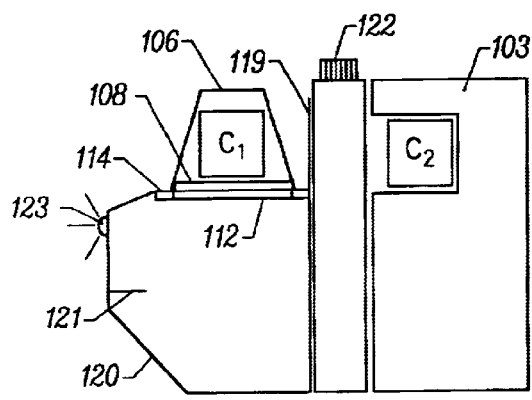
Figure 7L:
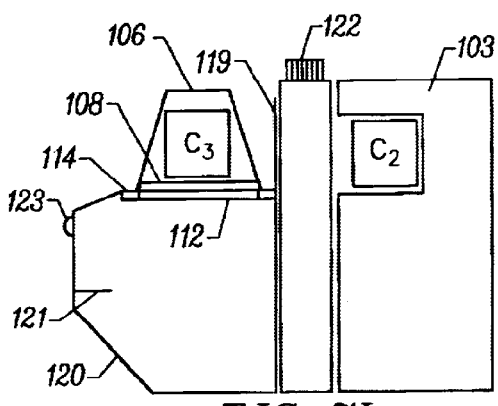

After the cassette $C_2$ is located within process tool 103 in accordance with the embodiments of either FIGS. 7G–7J or 8A–8C and is being processed, load port 102 and minienvironment 120 again move downward to the load height to couple the shell 106 with door 108 as shown in FIG. 7K, at which time, the pod including cassette $C_1$ is ready for transport away from load port 102. The alert 123 sends off an audible and/or visible signal as described above again indicating that the pod on load port 102 is ready for transport away from the system, and that a new pod, including for example a cassette $C_3$, is ready for lowering onto load port 102 as shown in FIG. 7L. The system shown in FIGS. 7K and 7L are identical to the system shown in FIGS. 7C and 7D. The system will continue to cycle through the positions shown in FIGS. 7C–7K until processing of the desired number of wafer lots is complete. After the last cassette has been loaded into process tool 103, an empty pod 104 is loaded on load port 102. The shell 106 and door 108 of this empty pod are separated, and when processing on the final cassette is completed, this cassette is loaded into the empty pod as described above so that it may be carried away from the load port 102.

While the present invention has been described thus far as relating to a cassette buffering system including a single storage shelf 121, it is understood that minienvironment 120 may be configured to include two or more storage shelves 121. One such embodiment is shown in FIGS. 9A–9J. In this embodiment, a second storage shelf 121 may be located directly under the storage shelf 121 shown in FIGS. 7A–7L. As in embodiments including a single shelf 121, the two shelves 121 are mounted in such a way that the shelves may pass through the horizontal plane including the stationary port door 112 as they vertically translate without contact or interference with the port door 112.

Figure 9A:
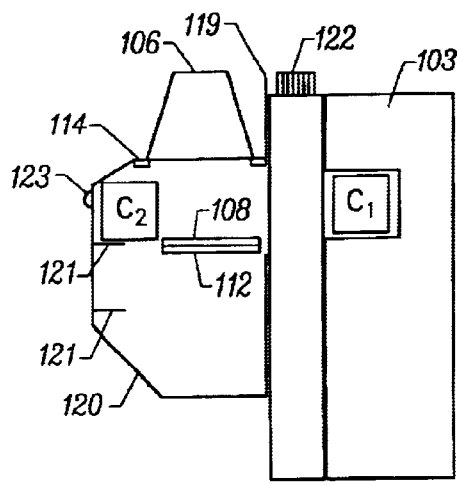
FIGS. 9A–9J are side views showing various positions of a cassette buffering system according to a further alternative embodiment of the present invention.
Figure 9B:
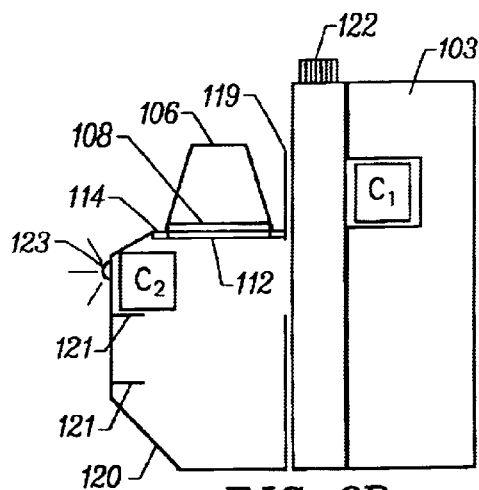
Figure 9C:
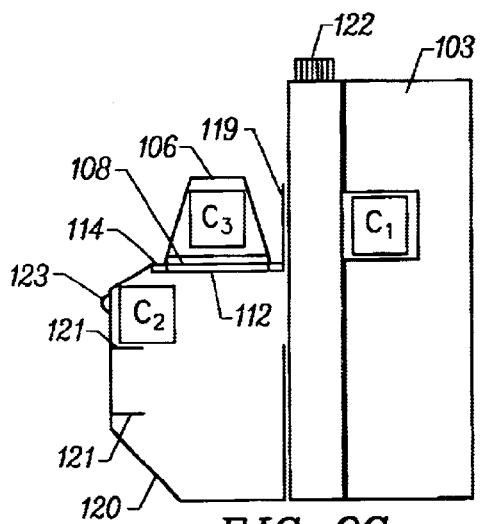
Figure 9D:
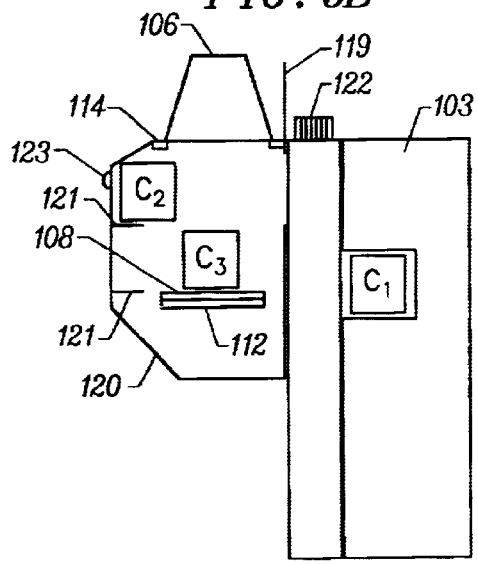
Figure 9E:
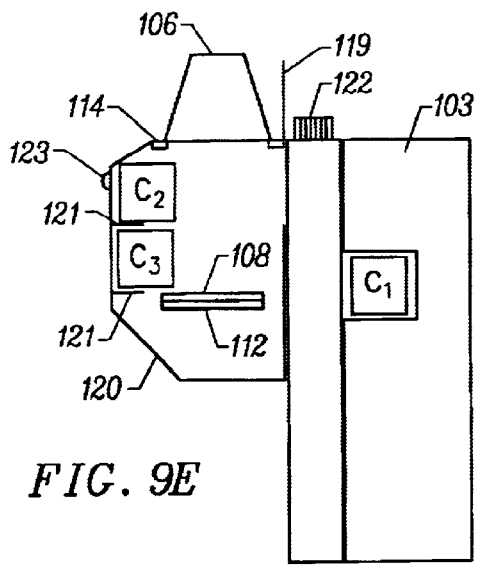

As shown in FIG. 9A, while a cassette $C_1$ is loaded within process tool 103, a cassette $C_2$ is loaded onto a shelf 121 within minienvironment 120 in accordance with the steps and positions of the system shown in FIGS. 7A–7F. Thereafter, according to this alternative embodiment, the load port 102 and minienvironment 120 lower down to the load height as shown in FIG. 8B. The alert 123 then indicates that the empty pod on the load port may be replaced by a new pod including for example a cassette $C_3$ as shown in FIG. 9C. Next, as processing continues on cassette $C_1$ within process tool 103, the shell 108, port plate 114, and minienvironment 120 raise upward as shown in FIG. 9D, and the transfer assembly 124 transfers the cassette $C_3$ to the second storage shelf 121 as shown in FIG. 9E.

Figure 9F:
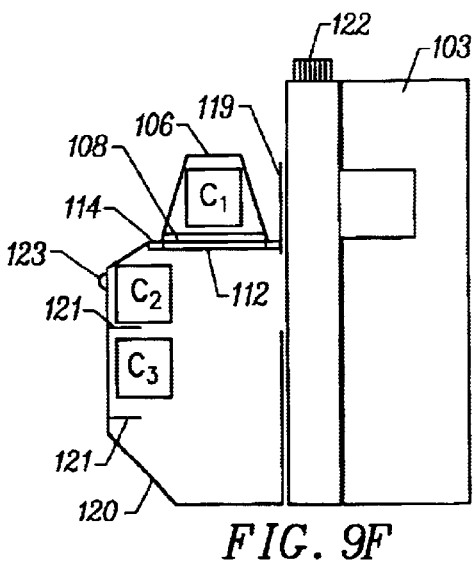
Figure 9G:
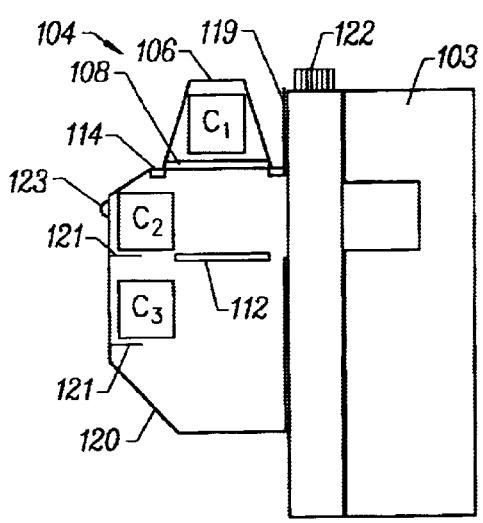
Figure 9H:
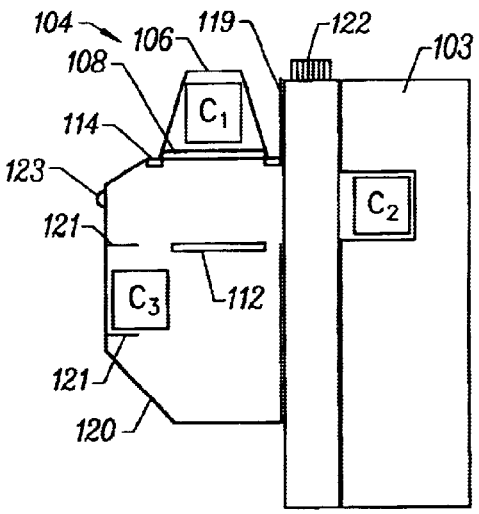
Figure 9I:
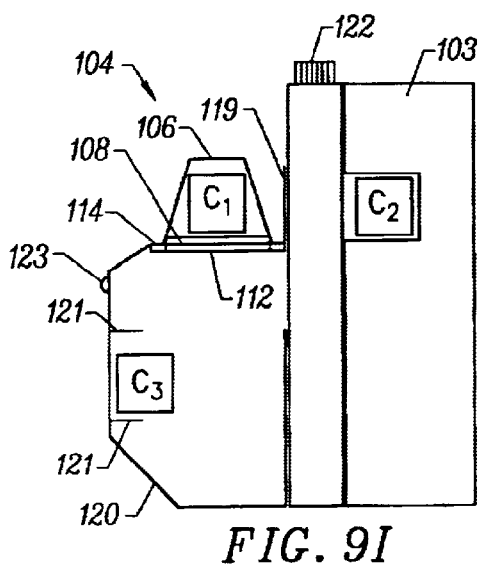
Figure 9J:
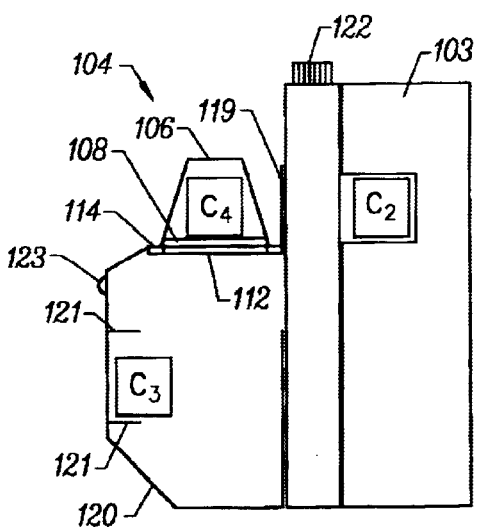
Figure 10:
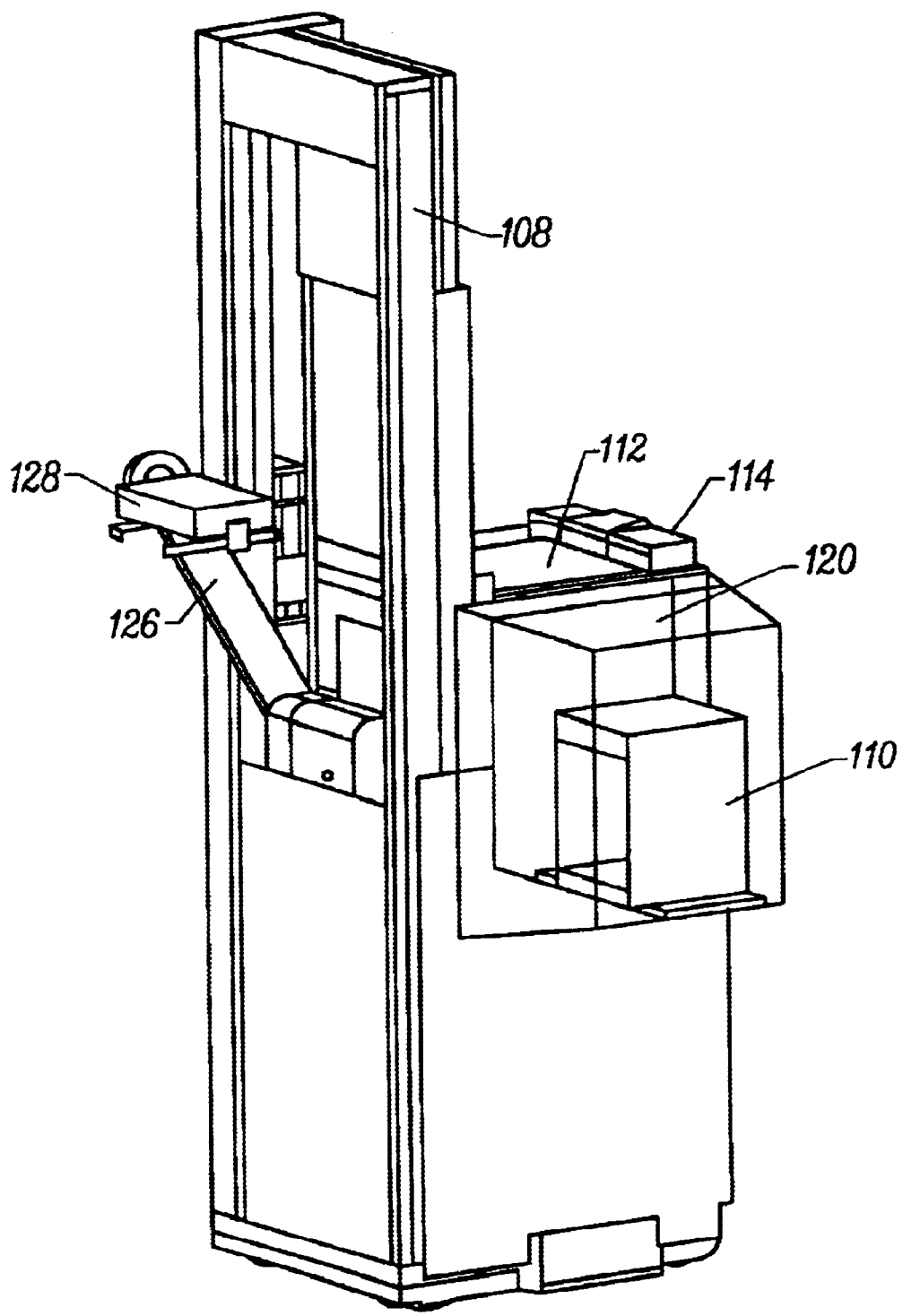
FIG. 10 is a perspective view showing a cassette buffering system according to a further alternative embodiment of the present invention.

Once processing on cassette $C_1$ is complete, the cassette $C_1$ is transferred by the transfer assembly 124 to the pod door 108 seated on port door 112, and the port plate is lowered so that the pod shell may be once again coupled to the pod door with the cassette $C_1$ contained therein as shown in FIG. 9F. Thereafter, as described with respect to FIGS. 7G–7J, the pod with cassette $C_1$ contained therein is raised as shown in FIG. 9G, and one of the stored cassettes, for example cassette $C_2$, is transferred by the transfer assembly 124 from its storage shelf 121 into the processing tool 103 as shown in FIG. 9H. Alternatively, the cassette $C_2$ may be transferred into the process tool at this point in accordance with the embodiments shown in FIGS. 8A–8C. Once the cassette $C_2$ is in the processing tool 103, the port plate is once again lowered to the load height. At that point, the alert 123 indicates that the pod on the load port is ready to be replaced by a new pod, such as for example a pod including cassette $C_4$, as shown in FIG. 7J. It is further contemplated that more than two shelves 121 may be provided vertically with respect to each other.

In the alternative embodiment containing multiple storage shelves 121 shown in FIGS. 9A–9J, the two storage shelves 121 are vertically aligned with respect to each other. In a further alternative embodiment shown in FIG. 10, it is understood that the storage shelves within the minienvironment 120 may be aligned side to side with respect to each other. In this embodiment, the gripper mechanism 128 may be mounted to a horizontal slide 140 of known construction, which is in turn mounted to the transfer arm 126. It is understood that the coupling of the gripper mechanism to the slide and/or the coupling of the slide to the transfer arm may include rotational components so that the gripper mechanism is capable of both rotation and horizontal translation with respect to the transfer arm. According to this embodiment, once a cassette has been separated from its pod, it may be moved by the transfer arm and slide to one of the side storage shelves and then later into the processing tool. It is additionally contemplated that the minienvironment may include a two dimensional combination of shelves oriented both up and down and side to side with respect to each other.

Figure 11A:
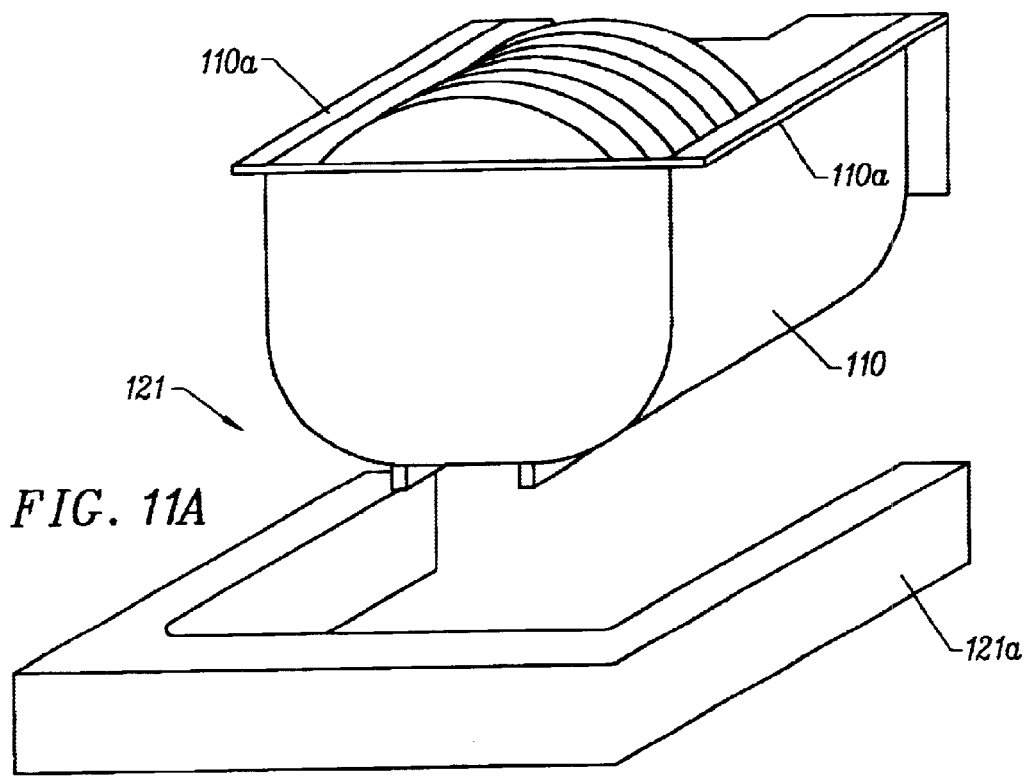
FIGS. 11A and 11B are perspective views showing alternative configurations for a shelf according to the present invention.
Figure 11B:
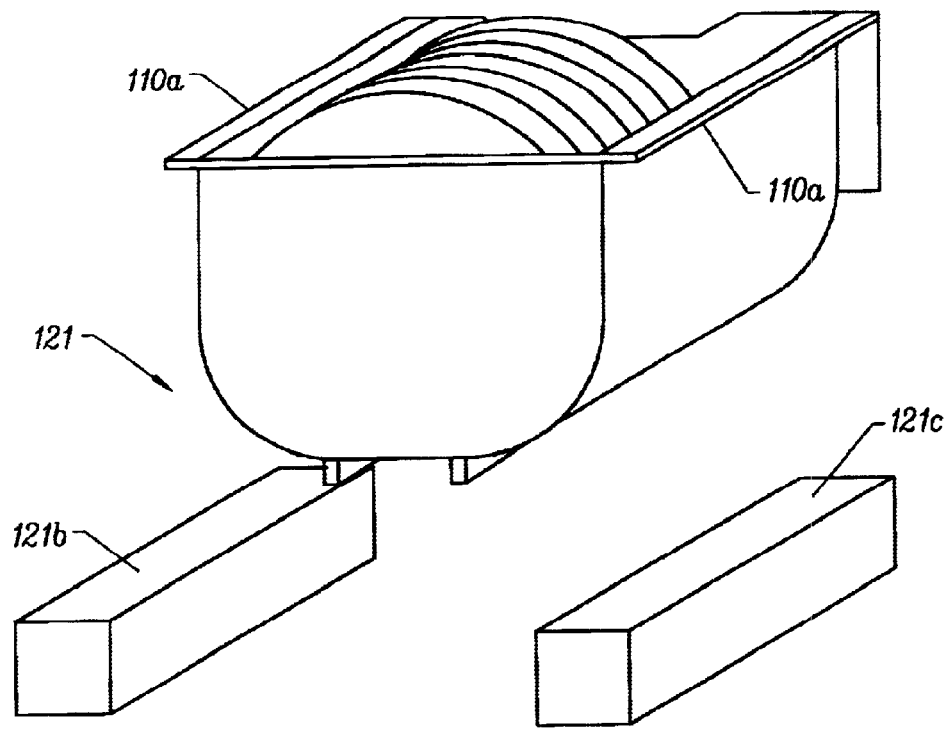

Up to this point, shelf 121 has been described as supporting a cassette 110 from a lower surface of the cassette. In an alternative embodiment of the present invention shown in FIG. 11A, it is understood that a shelf 121 may instead comprise a C-shaped ledge 121a which is sized to support cassette 110 by engaging a flange 110a conventionally formed on cassette 110. As opposed to the C-shaped ledge 121a, as shown in FIG. 11B, the shelf 121 may comprise two separate ledges 121b and 121c mounted to either frame 105, process tool 103 and/or minienvironment 120, and spaced apart to receive the cassette by supporting flange 110a of cassette 110.

Figure 12A:
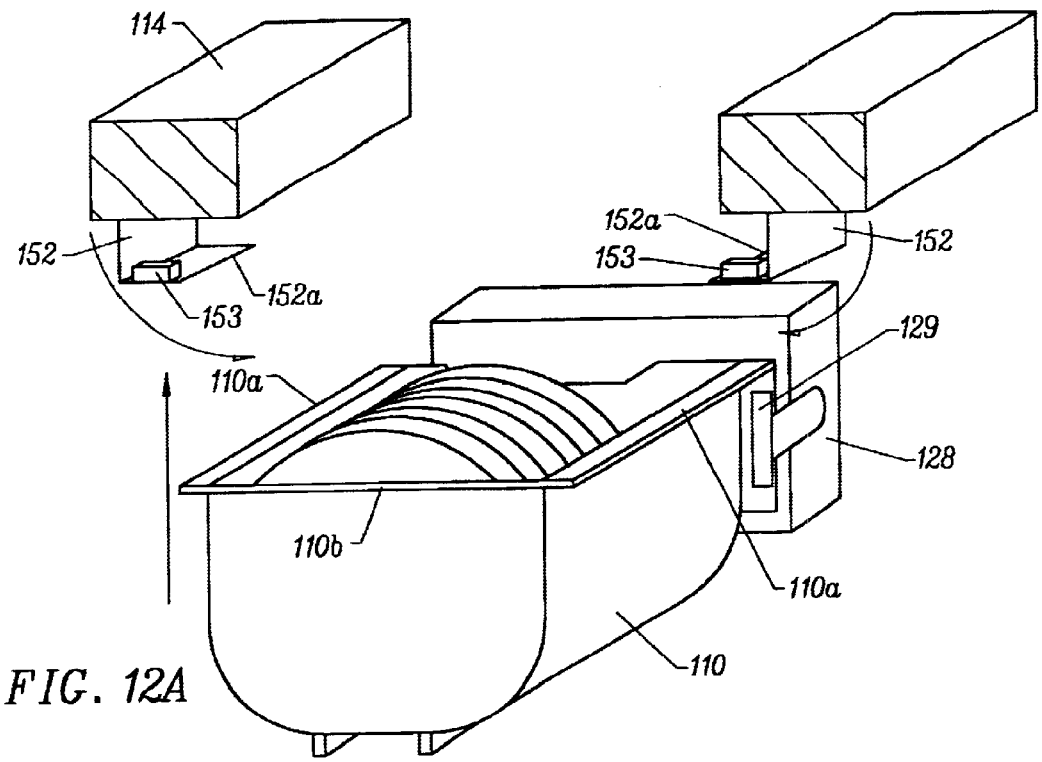
FIGS. 12A and 12B are perspective views showing a cassette buffering system operating according to another alternative embodiment of the present invention.
Figure 12B:
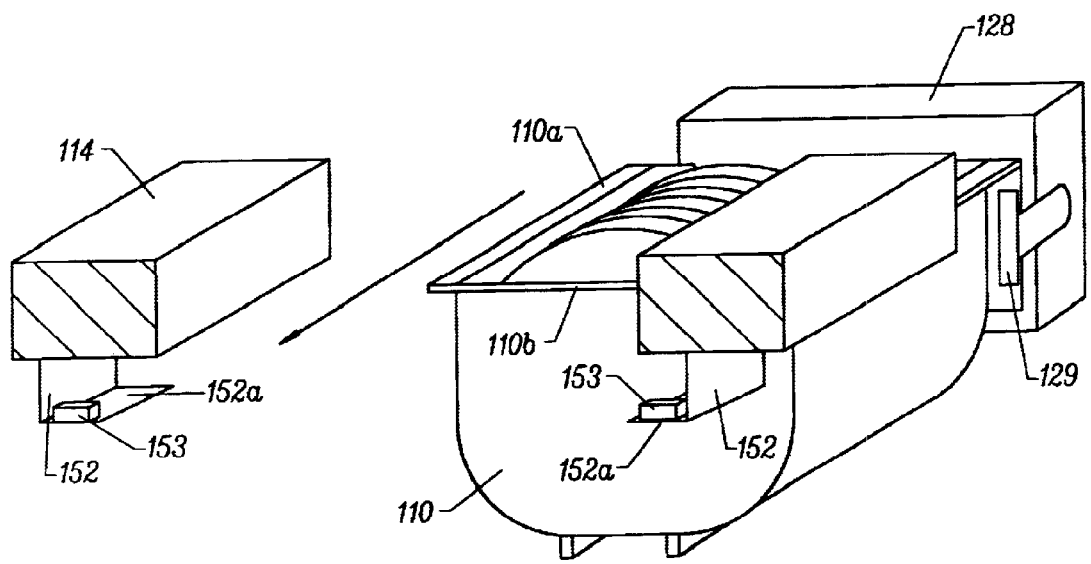

In a further alternative embodiment, active or passive grippers may be provided in or beneath port plate 114 for supporting a first cassette while processing of a second cassette in process tool 103 is taking place. Such alternative embodiments are shown in part in FIGS. 12A and 12B. In the embodiment of FIGS. 12A and 12B, port plate 114 (shown in partial cross-section in FIGS. 12A and 12B) includes active grippers 152. Grippers 152 normally reside in a retracted position within the port plate. In operation, after the gripper mechanism 128 has grabbed a cassette 110 from the port door, and rotated the cassette 90° as described above and as shown in FIGS. 12A and 12B, the gripper mechanism 128 may raise the cassette upward until the cassette is positioned near the bottom of port plate 114. Thereafter, grippers 152 rotate down and in so that a portion 152a on each gripper can engage the flange 110a conventionally formed on cassette 110 to thereby support cassette 110 on the grippers 152.

The grippers 152 include stops 153 formed near an edge of the gripper. Once the cassette has been raised and the grippers have rotated into position so that the flanges 110a are above the portions 152a, the transfer mechanism then translates the cassette horizontally until an top edge 110b of the cassette 100 abuts the stops 153. At that point, the gripping mechanism 128 may then disengage from the cassette. After a processed cassette is removed from the process tool and seated on the pod door, transfer assembly 124 may then engage the cassette 110 supported on grippers 152. Grippers 152 may thereafter retract to their home position, and the transfer assembly 124 may transfer cassette 110 into the process tool for processing.

The embodiment of the present invention shown in FIG. 12B is similar to that of FIG. 12A with the exception that grippers 152 are passive, i.e., they are mounted to the bottom of port plate 114 in a fixed position as shown in FIG. 12B. According to the embodiment in FIG. 12B, the transfer assembly 124 slides the cassette 110 horizontally, near to the bottom of port plate 114, so that the flange 110a is positioned over portion 152a of grippers 152.

The stops 153 are provided on portions 152a so that as the flanges 110a slide the over the portions 152a, the top edge 110b will up against the stops 153. Thereafter, the transfer assembly 124 may lower the cassette so that it is supported on grippers 152, and the gripper mechanism 128 may then disengage from the cassette 110. The stops 153 are provided with a height that allows the transfer assembly 124 to raise the cassette and slide the flange 110 over the stops to free the cassette 110 from the grippers 152.

It is understood that other active or passive grippers affixed within or to the bottom of port plate 114 may be used in alternative embodiments. For example, U.S. Pat. No. 5,788,458 discloses a pair of grippers pivotally mounted to the port plate about vertical axes. Such grippers could be used in accordance with the embodiment of the present invention shown in FIGS. 12A and 12B. In particular, the gripping mechanism 128 would vertically translate the cassette 110 until flanges 110a of cassette 110 are located in the horizontal plane of the port plate grippers. At that point, the port plate grippers would rotate inward into engagement with flange 110a to thereby grip and support the cassette. U.S. Pat. No. 5,788,458 is assigned to the owner of the present invention, and is incorporated by reference herein in its entirety.

Figure 13A:
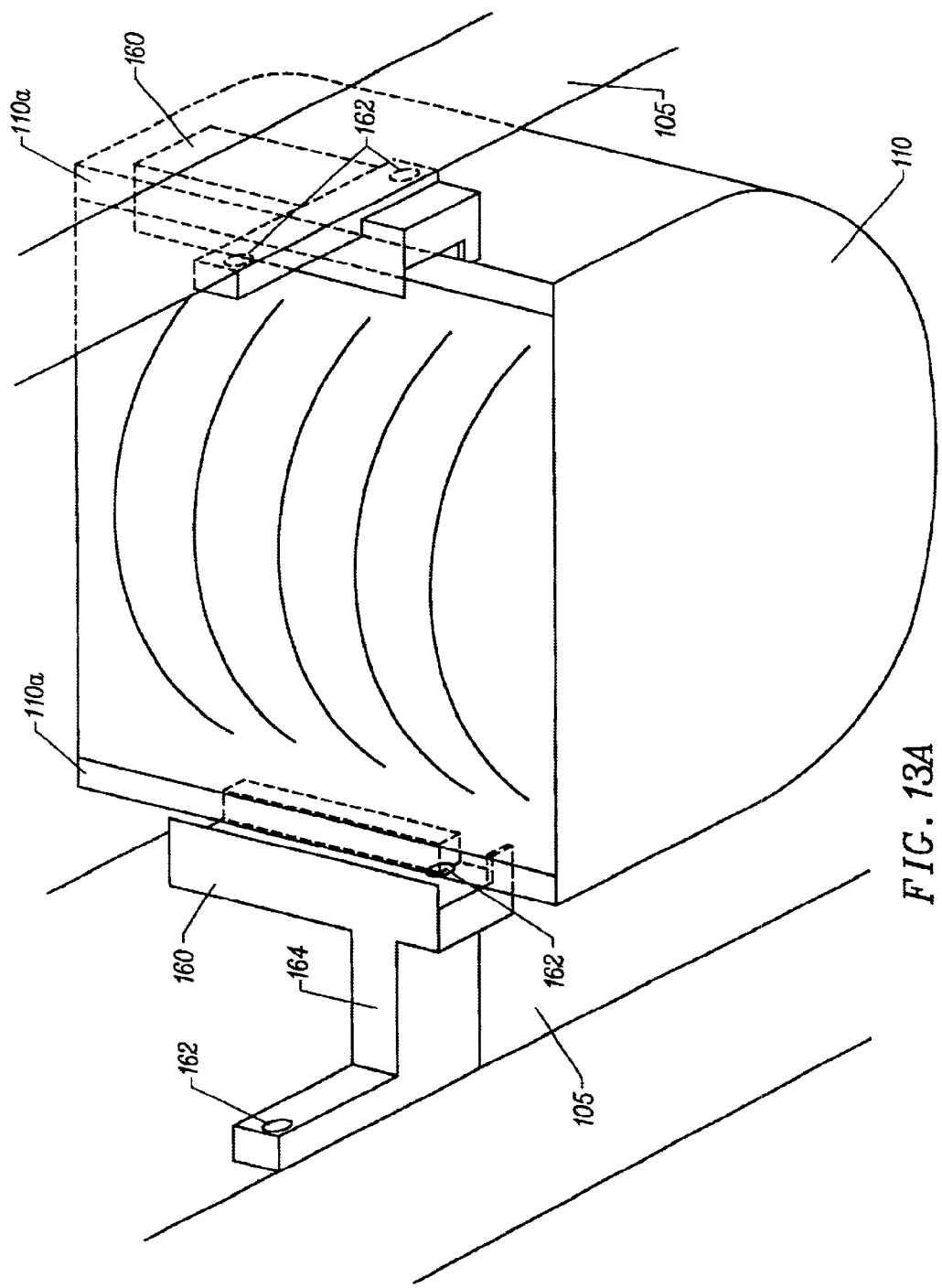
FIGS. 13A and 13B are partial perspective views showing a cassette buffering system operating according to another alternative embodiment of the present invention.
Figure 13B:
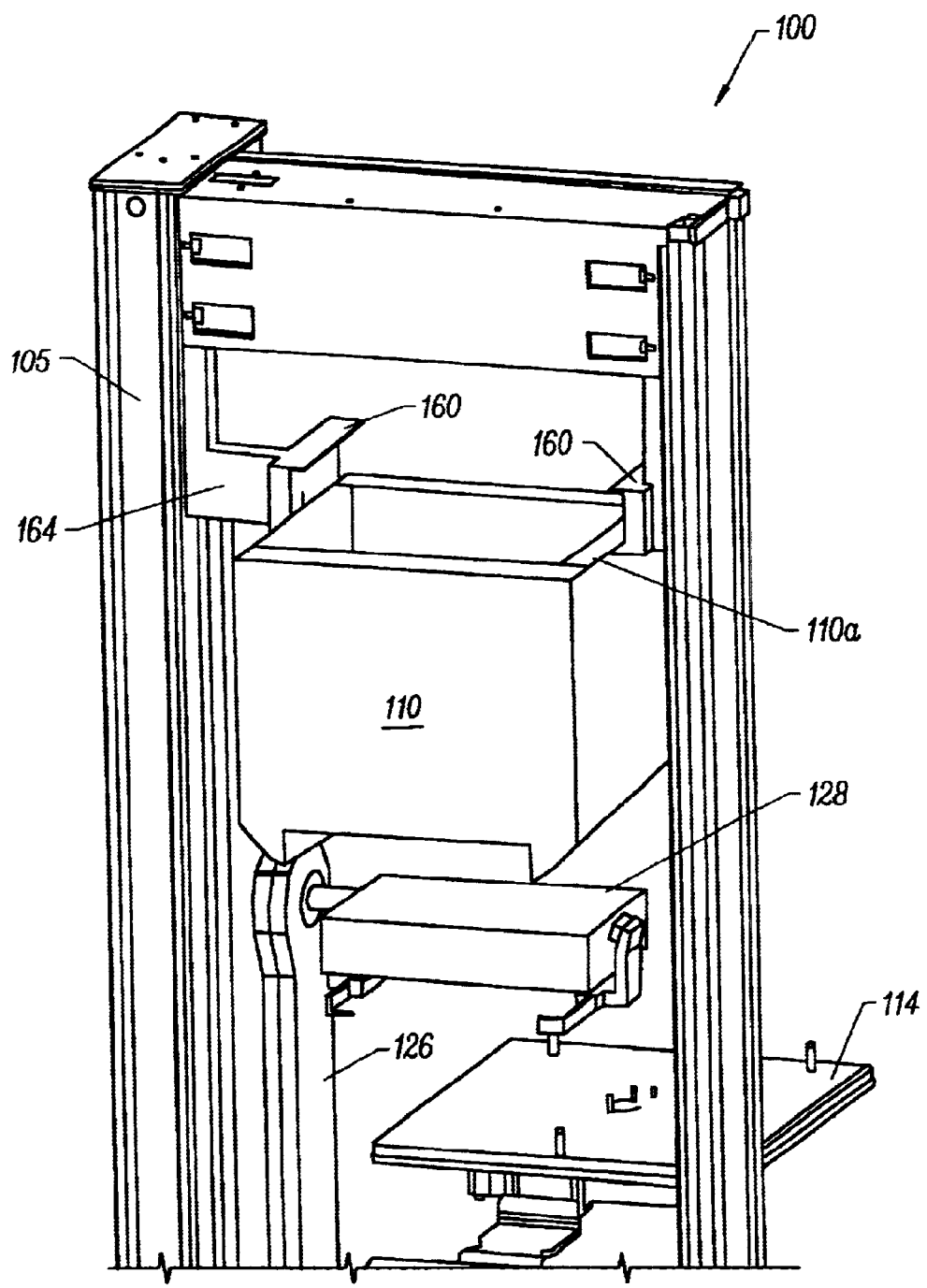

Additionally, it is understood that grippers may be fixedly mounted to the frame 105. Such an embodiment is shown in FIGS. 13A and 13B. In this alternative embodiment, grippers 160 may be affixed to the frame via bolts, screws or other fasteners 162. One or both grippers 160 may be spaced from the frame 105 via a bracket 164 to ensure that the grippers do not interfere with the components, such as chassis 116 of the transfer assembly 124, which translate along the lead screw 118. In this embodiment, the transfer assembly may position the cassette so that flanges 110a of the cassette 110 are supported on the grippers 160 as shown.

It is further understood that the various embodiments described above may be combined to provide multiple storage shelves 121. For example, a first shelf 121 may be provided in the frame 105 (as in FIGS. 5A–5J), and a second shelf 121 may be provided in the minienvironment 120 (as in FIGS. 7A–7L) and/or grippers 152 may be affixed to the bottom of the port plate (as in FIGS. 12A and 12B). Other configurations are contemplated.

While a preferred mode of operation is disclosed above, it is understood that various other modes are contemplated. For example, it is contemplated that a cassette including "dummy" wafers be stored on a storage shelf Some process tools require a certain number of wafers, e.g. 25 wafers, for the lot to be properly processed. However, it may happen that a wafer cassette includes only 23 wafers. In this instance, the 23 wafers from the active cassette could be loaded into the process tool, then the active cassette could be switched out with the cassette including dummy wafers, which then provides the remaining two wafers. After processing is complete, the two dummy wafers are returned to their cassette, the cassettes switched out again, and the original 23 wafers returned to the active cassette. Alternatively, a cassette including monitoring wafers may be buffered on a storage shelf In this instance, after the wafers from an active cassette are loaded into the process tool, the cassettes could be switched out, and a monitoring wafer added to the tool. After processing is complete, the monitoring wafer is returned to its cassette, the cassettes switched out again, and the active wafers returned to the active cassette. After each of the monitoring wafers has been processed, the cassette including the monitoring wafers can be removed and tested, and a new cassette including monitoring wafers can be stored on the storage shelf.

Additionally, although in a preferred embodiment a cassette will be loaded into the process tool whenever the process tool is free, it is contemplated that a cassette may be transferred to either a storage shelf 121 or the process tool 103 when both are available. The determination as to whether the cassette gets transferred to the storage shelf or the process tool may be controlled by the system software based on one or more conditions existing at the time the cassette is loaded into the minienvironment. Alternatively, an operator can make the determination as to where a loaded cassette is to be transferred. Additionally, it is understood that in embodiments including two or more shelves, the cassettes may be loaded onto any available shelf, and may additionally be transferred between the shelves.

It is known to provide either an IR tag or RF pill on a pod, which tag or pill includes electronics for receiving and/or transmitting information identifying and relating to the wafers contained within the pod. Such RF pills, and systems making use thereof, are described for example in U.S. Pat. Nos. 4,827,110 and 4,888,473 to Rossi et al., and U.S. Pat. No. 5,339,074 to Shindley. It is also known to provide the IR pills on the cassettes themselves. IR tags, and systems making use thereof, are described for example in U.S. Pat. Nos. 5,097,421, 4,974,166 and 5,166,884 to Maney et al. Each of the above-identified patents is assigned to the owner of the present invention, and each is incorporated by reference in its entirety herein.

According to the present invention, a pod is loaded onto the load port 102 with a first cassette, but leaves with a second cassette. Thus, the present invention works in tandem with the RF or IR system so that after a new cassette has been loaded into a particular pod, information relating to the wafers within the new cassette is transmitted to and stored in the RF pill or IR tag on the pod. Thus, identification and other information for a particular wafer lot will always be correctly stored in the pod in which the wafers are being transported.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. An interface for transferring cassettes between a pod having a pod door and a pod shell, and a processing tool, comprising:

a load port having a port door used to support the pod door and a port plate used to support the pod shell when the pod is seated on said load port, said load port capable of decoupling the pod door from the pod shell;

a protective enclosure mechanically connected to said port plate, said protective enclosure capable of traveling between a first position where the cassette is located within the pod, and a second position where the pod shell is separated from the pod door and said protective enclosure encompasses and isolates the cassette from ambient atmospheric conditions;

at least one cassette support shelf located within said protective enclosure, said cassette support shelf capable of supporting a first cassette while a second cassette is simultaneously supported on the pod door; and a transfer arm assembly used to transfer cassettes between said cassette support shelf, the pod door, and the processing tool.

2. The interface according to claim 1, wherein said port plate travels along a predetermined vertical path when said protective enclosure travels between said first and second position.

3. A device for transferring cassettes between a SMIF pod having a pod door and a pod shell, and a processing tool having an access port, comprising:

a load port having a port door capable of supporting the pod door and a port plate capable of supporting the pod shell, said load port capable of decoupling the pod door from the pod shell;

a protective enclosure mechanically connected to said port plate, said protective enclosure capable of traveling between a lowermost position where the pod door contacts the pod shell, and an uppermost position where the pod shell is separated from the pod door and said protective enclosure encompasses the cassette;

a protective shield mechanically connected to said protective enclosure, said protective shield preventing cassettes from traveling through the access port when said protective enclosure is located in said lowermost position, and said protective shield allowing cassettes to travel through the access port when said protective enclosure is located in said uppermost position;

a cassette support shelf located within said protective enclosure, said cassette support shelf allowing the device to simultaneously store a cassette on the pod door and said cassette support shelf;

a transfer assembly capable of transferring cassettes between the pod door, said cassette support shelf, and the processing tool.

4. The device according to claim 3, wherein said port plate vertically lifts the pod shell from the pod door.

5. The device according to claim 4, further including a fan-filter unit.

6. An apparatus for transferring cassettes between a SMIF pod having a pod door and a pod shell, and a processing tool, comprising:

port door used to support the pod door and a port plate used to support the pod shell, said port door capable of decoupling the pod door from the pod shell;

a protective enclosure mechanically connected to said port plate, said protective enclosure capable of traveling between a first position where the cassette is located within the pod, and a second position where the pod shell is separated from the pod door and said protective enclosure encompasses the cassette;

at least one cassette support shelf located within said protective enclosure, said cassette support shelf capable of supporting a first cassette while a second cassette is simultaneously supported on the pod door; and means for transferring cassettes between said cassette support shelf, the pod door, and the processing tool.

7. A load port assembly for transferring cassettes between a SMIF pod having a pod door and a pod shell, and a processing tool, comprising:

a pod support structure having a port door for supporting the pod door and a port plate for supporting the pod shell when a pod is seated on said pod support structure, said port door capable of decoupling the pod door from the pod shell;

a protective enclosure mechanically connected to said port plate, said protective enclosure capable of traveling vertically between a first position where said port door contacts said port plate, and a second position where the pod shell is separated from the pod door and said protective enclosure encompasses the cassette;

at least one cassette support shelf located within said protective enclosure, said cassette support shelf capable of supporting a first cassette while a second cassette is simultaneously seated on the pod door; and a transfer arm assembly for transferring cassettes between said cassette support shelf, the pod door, and the processing tool.

8. The load port according to claim 7, wherein two cassette support shelves are located within said protective enclosure.

9. An interface for transferring cassettes between a pod having a pod door and a pod shell, and a processing tool, comprising:

a load port capable of decoupling the pod door from the pod shell, including:

a port door capable of supporting the pod door when the pod is seated on said load port;

a port plate capable of supporting the pod shell when the pod is seated on said load port;

a protective enclosure mechanically connected to said port plate, said protective enclosure capable of traveling between a first position where the pod door contacts the pod shell and a second position where the pod shell is separated from the pod door and said protective enclosure encompasses the cassette;

a cassette support shelf mounted within said protective enclosure, said cassette support shelf capable of supporting a first cassette while a second cassette is simultaneously supported on the pod door; and a transfer arm assembly capable of transferring cassettes between said cassette support shelf, the pod door, and the processing tool.

* * * * *